(12) United States Patent
Shukla et al.

(10) Patent No.: US 9,875,929 B1
(45) Date of Patent: *Jan. 23, 2018

(54) THREE-DIMENSIONAL MEMORY DEVICE WITH ANNULAR BLOCKING DIELECTRICS AND DISCRETE CHARGE STORAGE ELEMENTS AND METHOD OF MAKING THEREOF

(71) Applicant: SANDISK TECHNOLOGIES LLC, Plano, TX (US)

(72) Inventors: Keerti Shukla, Saratoga, CA (US); Raghuveer S. Makala, Campbell, CA (US); Rahul Sharangpani, Fremont, CA (US); Fei Zhou, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/413,034

(22) Filed: Jan. 23, 2017

(51) Int. Cl.
| | |
|---|---|
| *H01L 21/76* | (2006.01) |
| *H01L 21/768* | (2006.01) |
| *H01L 27/11524* | (2017.01) |
| *H01L 27/11556* | (2017.01) |
| *H01L 27/1157* | (2017.01) |

(Continued)

(52) U.S. Cl.
CPC .... *H01L 21/7682* (2013.01); *H01L 21/76814* (2013.01); *H01L 21/76877* (2013.01); *H01L 23/5226* (2013.01); *H01L 23/5283* (2013.01); *H01L 23/5329* (2013.01); *H01L 23/53209* (2013.01); *H01L 23/53214* (2013.01); *H01L 23/53242* (2013.01); *H01L 23/53257* (2013.01); *H01L 27/1157* (2013.01); *H01L 27/11524* (2013.01); *H01L 27/11556* (2013.01); *H01L 27/11582* (2013.01)

(58) Field of Classification Search
CPC .................................................. H01L 21/7682
See application file for complete search history.

(56) References Cited

U.S. PATENT DOCUMENTS

| | | | |
|---|---|---|---|
| 5,915,167 A | 6/1999 | Leedy | |
| 9,484,357 B2 * | 11/2016 | Makala | ............ H01L 27/11582 |

(Continued)

OTHER PUBLICATIONS

U.S. Appl. No. 14/925,171, filed Oct. 28, 2015, Sharangpani et al.

(Continued)

*Primary Examiner* — William Coleman
(74) *Attorney, Agent, or Firm* — The Marbury Law Group PLLC

(57) ABSTRACT

A memory opening is formed through an alternating stack of sacrificial material layers and electrically conductive layers located over a substrate. Discrete annular dielectric metal oxide structures are formed on sidewalls of the electrically conductive layers around the memory opening. After forming memory stack structures including the annular dielectric metal oxide structures in the memory opening, lateral recesses are formed by removing the sacrificial material layers selective to the electrically conductive layers. Sacrificial material layers in the memory stack structure are etched at levels of the lateral recesses to form discrete annular structures at each level of the electrically conductive layers, each of which includes, from inside to outside, a respective annular charge storage structure, and a respective blocking dielectric comprising an annular dielectric metal oxide structure.

24 Claims, 29 Drawing Sheets

(51) Int. Cl.

| | | |
|---|---|---|
| *H01L 27/11582* | (2017.01) | |
| *H01L 23/522* | (2006.01) | |
| *H01L 23/528* | (2006.01) | |
| *H01L 23/532* | (2006.01) | |

(56) References Cited

U.S. PATENT DOCUMENTS

| | | | |
|---:|---|---|---|
| 9,502,471 B1 * | 11/2016 | Lu | H01L 27/2481 |
| 9,520,485 B2 * | 12/2016 | Lue | H01L 21/28282 |
| 9,530,790 B1 * | 12/2016 | Lu | H01L 27/11582 |
| 9,543,318 B1 * | 1/2017 | Lu | H01L 27/11582 |
| 9,576,966 B1 * | 2/2017 | Peri | H01L 27/115 |
| 9,576,967 B1 * | 2/2017 | Kimura | H01L 27/1157 |
| 9,576,975 B2 | 2/2017 | Zhang et al. | |
| 9,589,839 B1 * | 3/2017 | Ikawa | H01L 21/76888 |
| 9,601,508 B2 * | 3/2017 | Sel | H01L 29/04 |
| 2016/0064532 A1 | 3/2016 | Makala et al. | |

OTHER PUBLICATIONS

Endoh, T. et al., titled "Novel Ultra High Density Memory With a Stacked-Surrounding Gate Transistor (S-SGT) Structured Cell", IEDM Proc. (2001) 33-36.

Tsubouchi, K. et al., "Selective Aluminum Chemical Vapor Deposition." *Journal of Vacuum Science & Technology A: Vacuum, Surfaces, and Films, vol. 10* (1992): 856.

Zhao, C., et al., "Thermal Stability of High K Layers," *MRS Proc. MRS Proceedings* 745 (2002).

\* cited by examiner

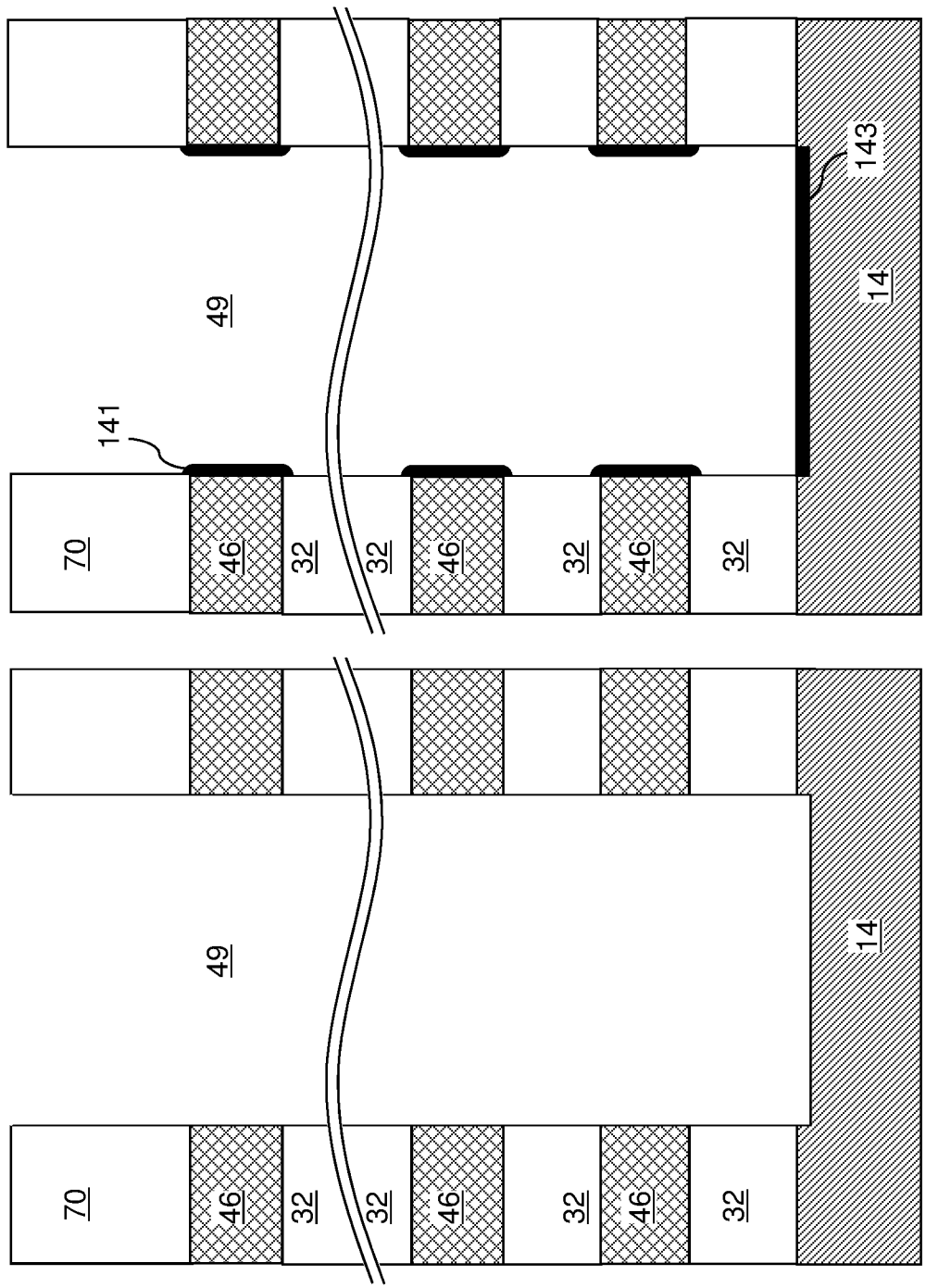

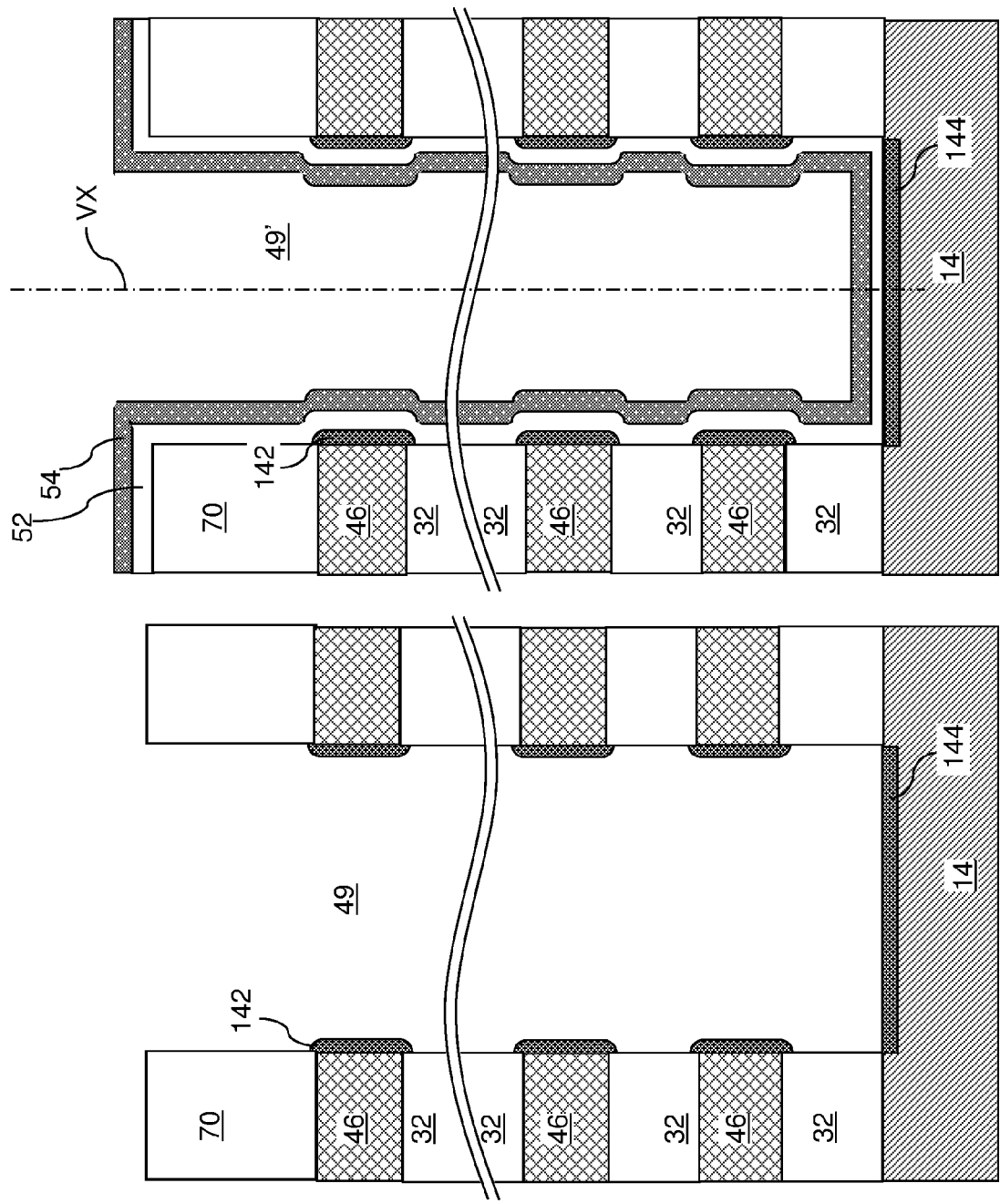

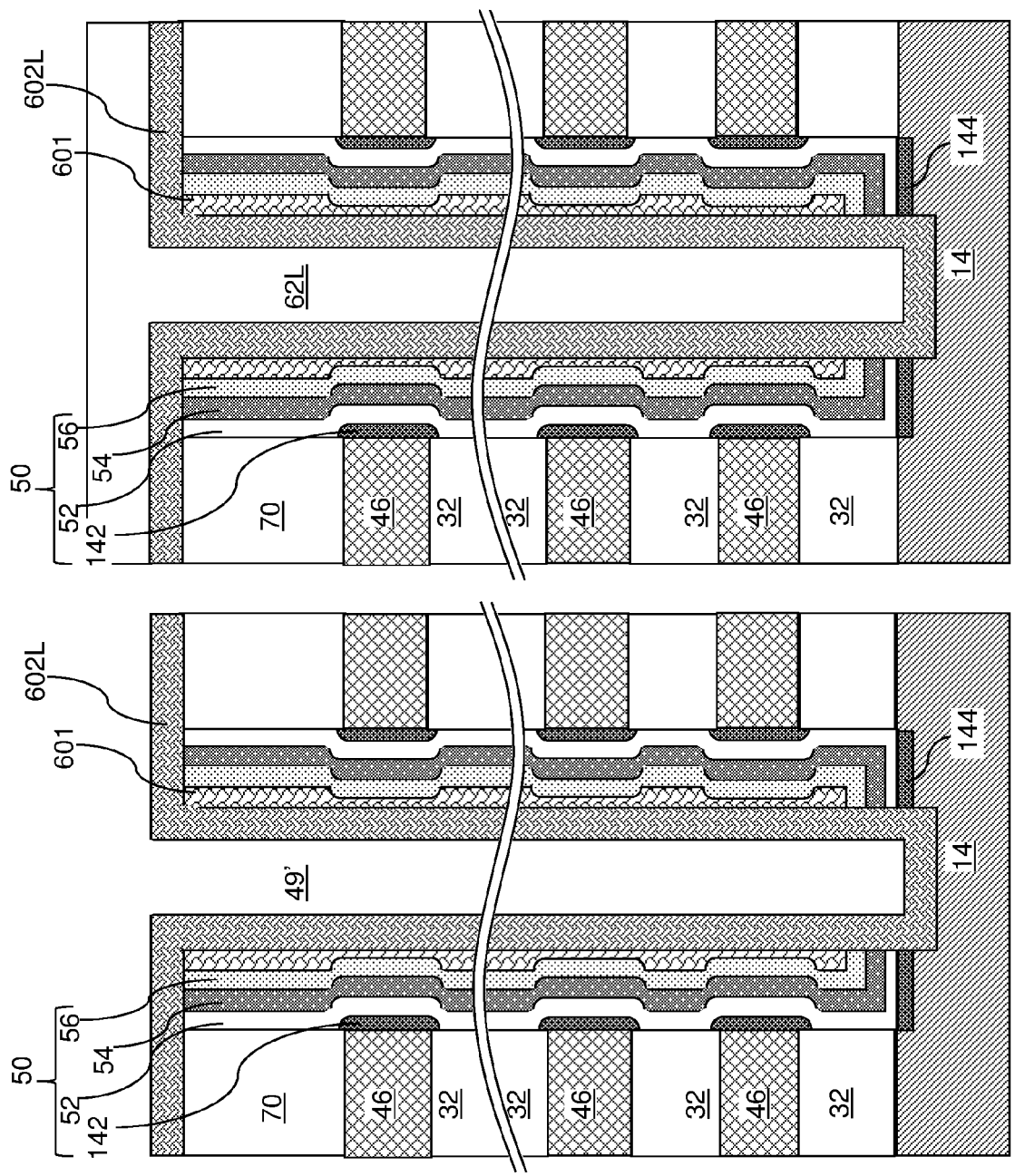

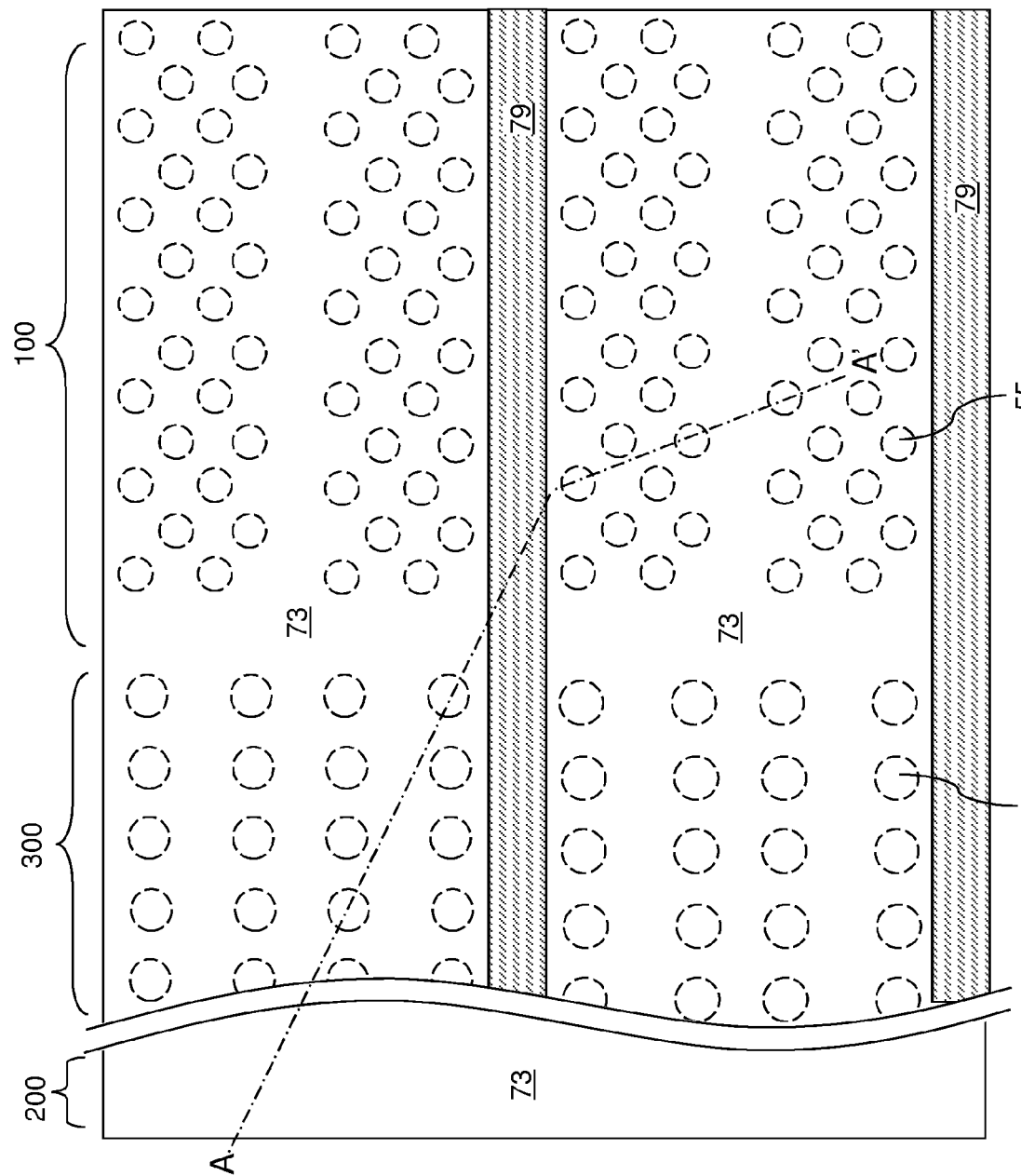

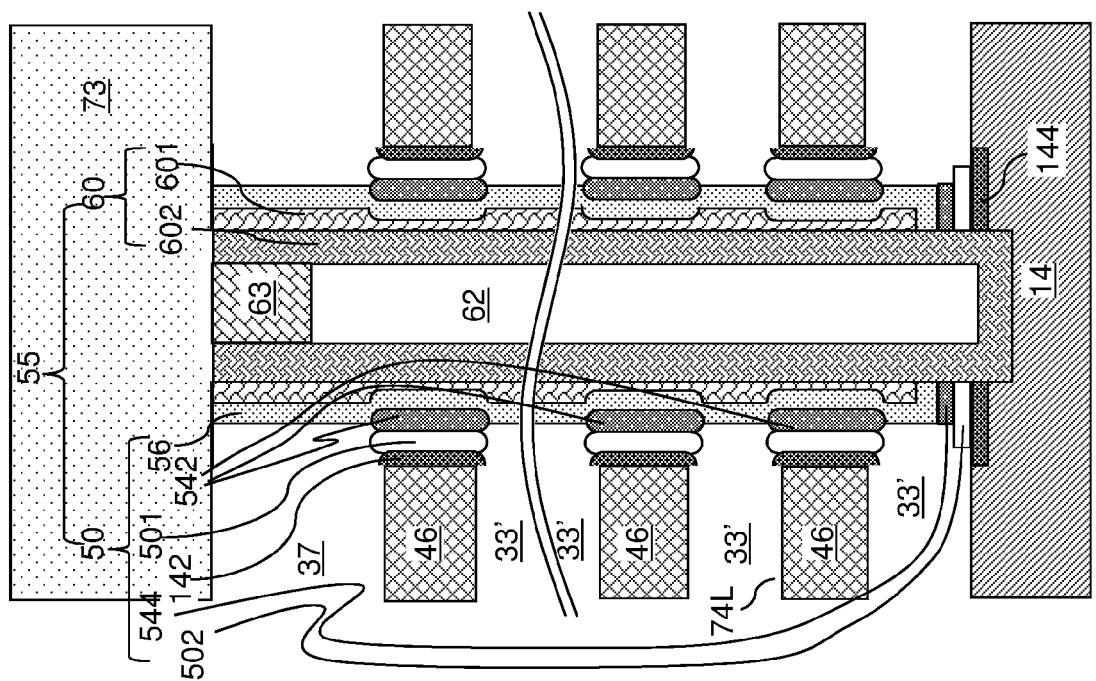
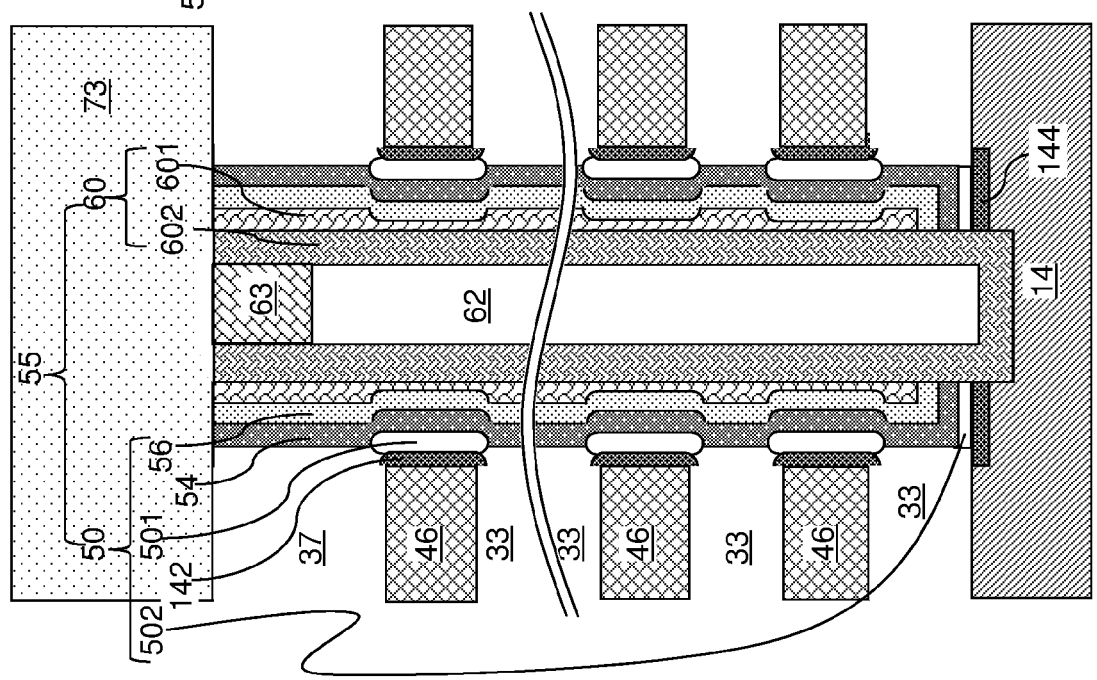

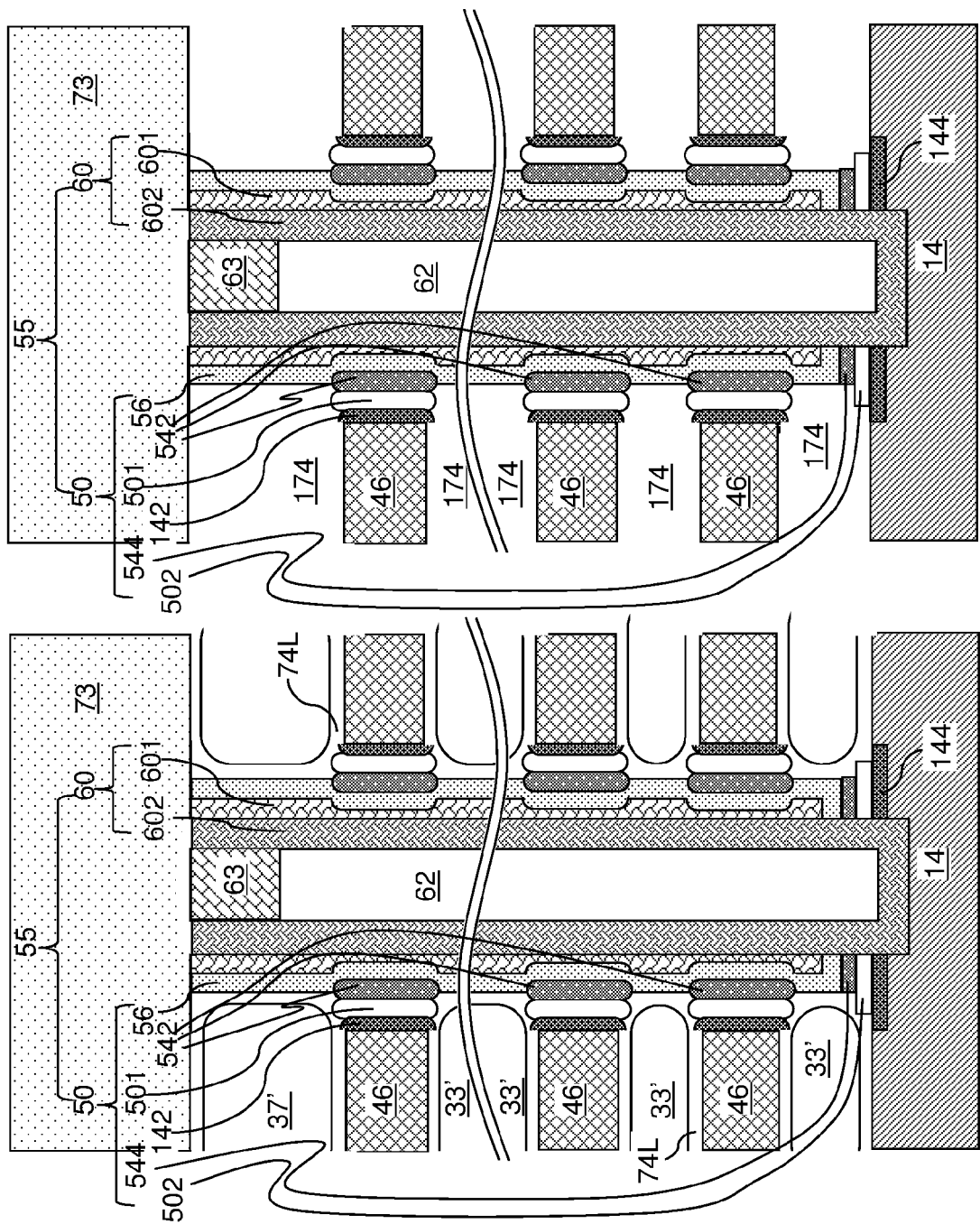

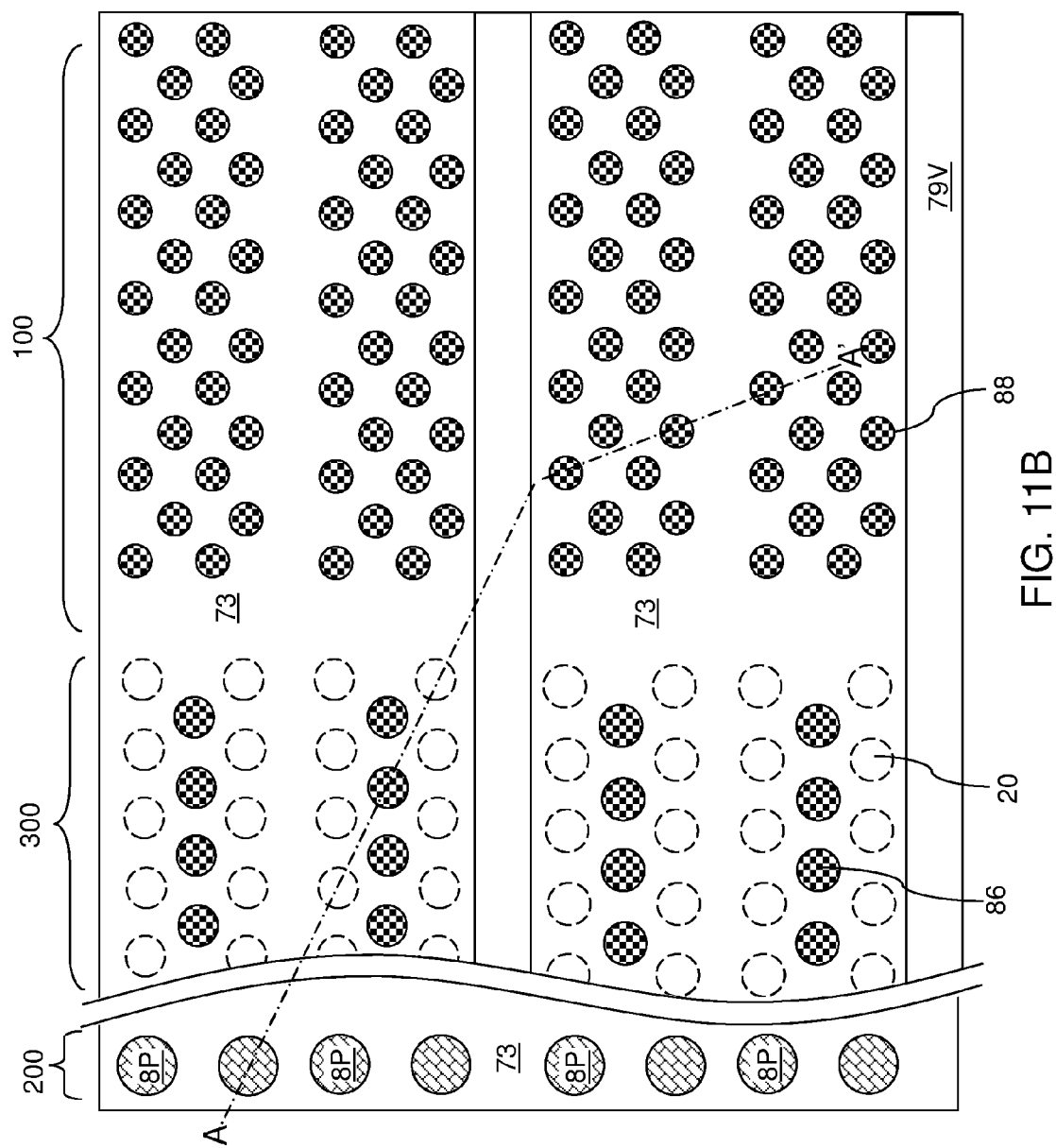

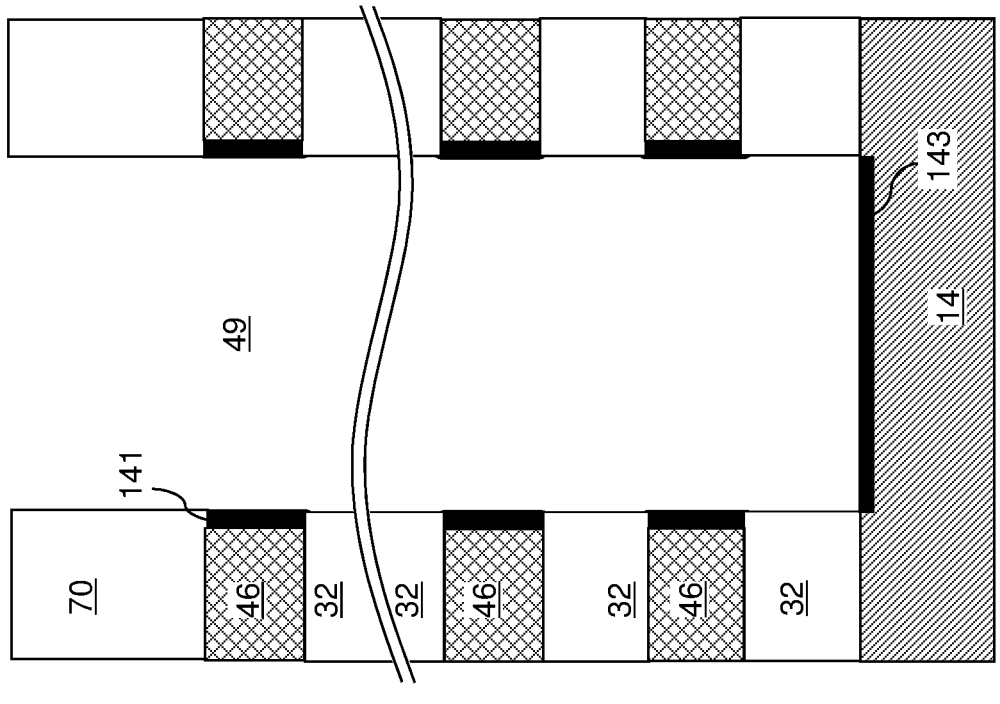
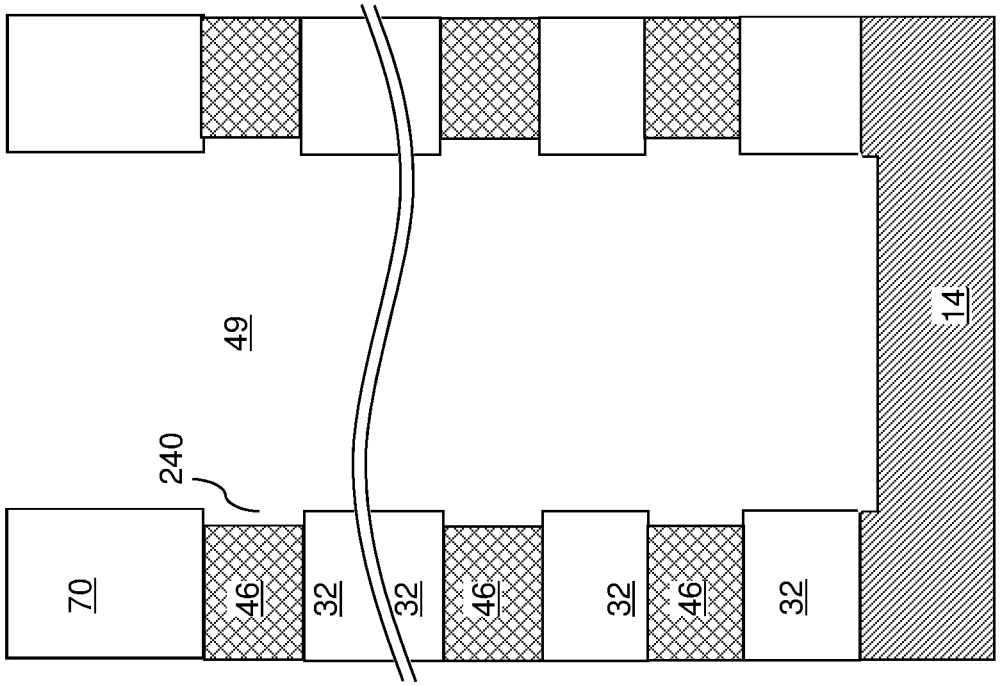

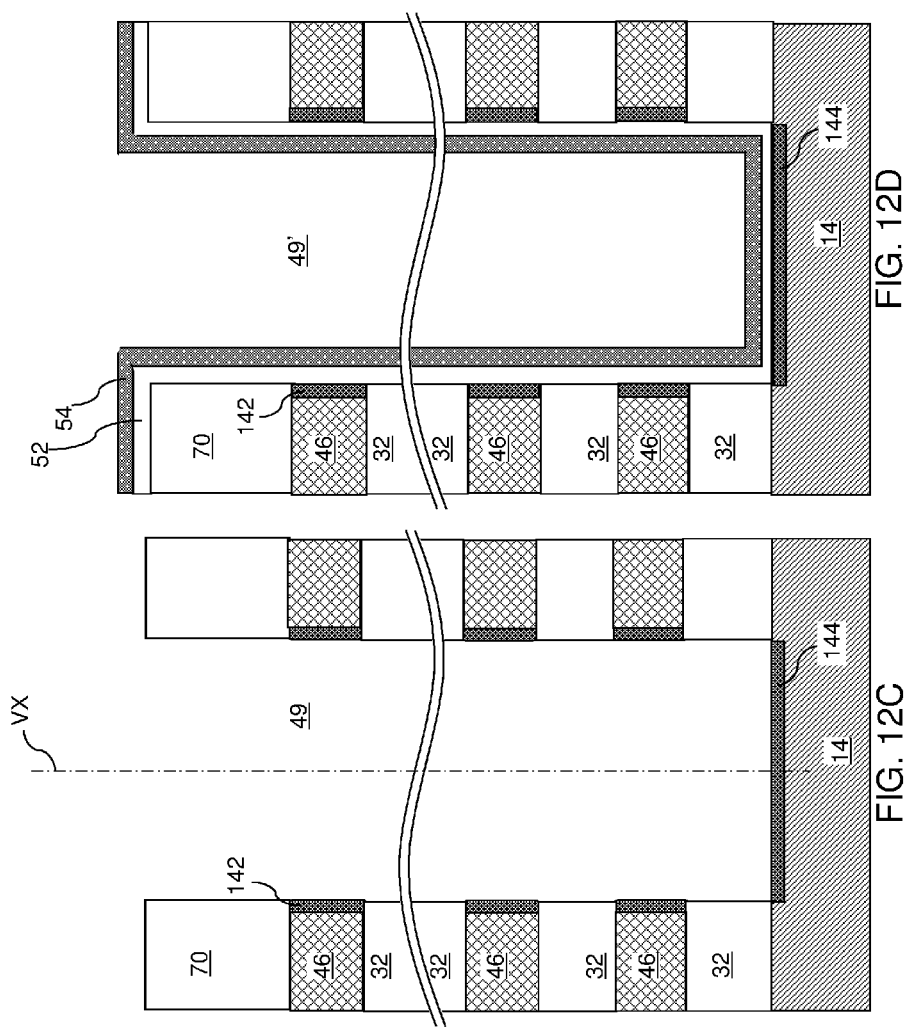

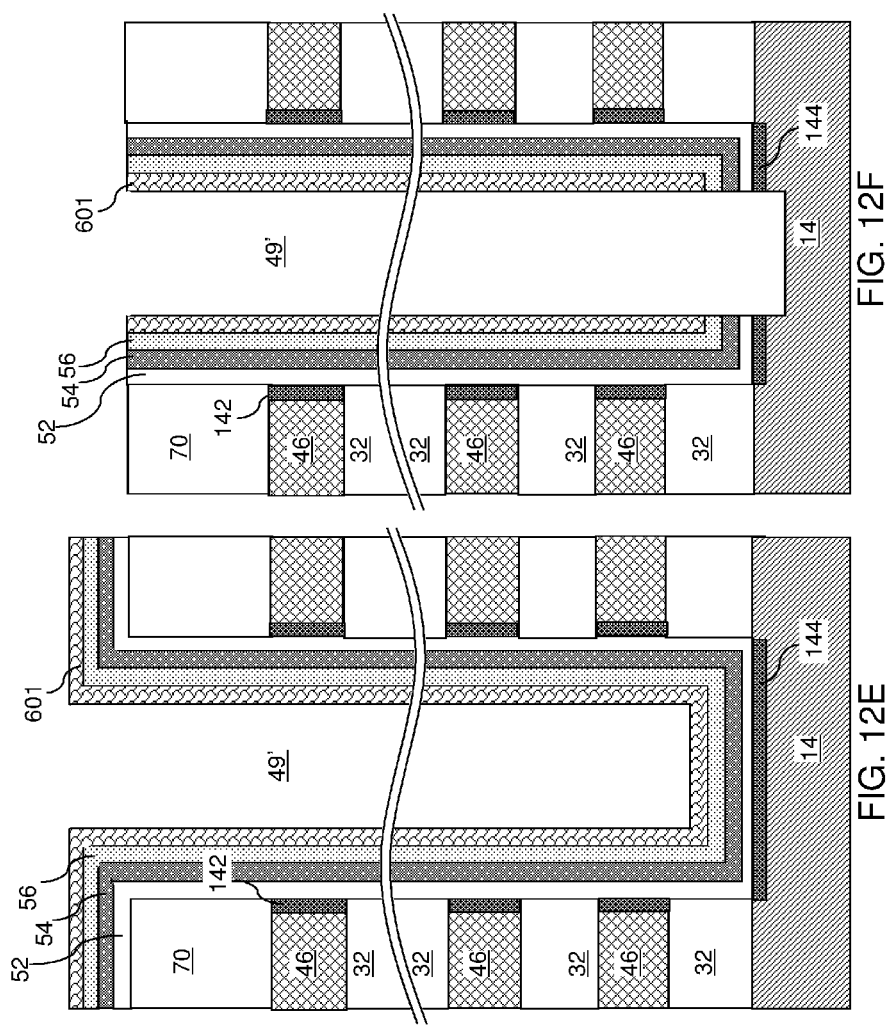

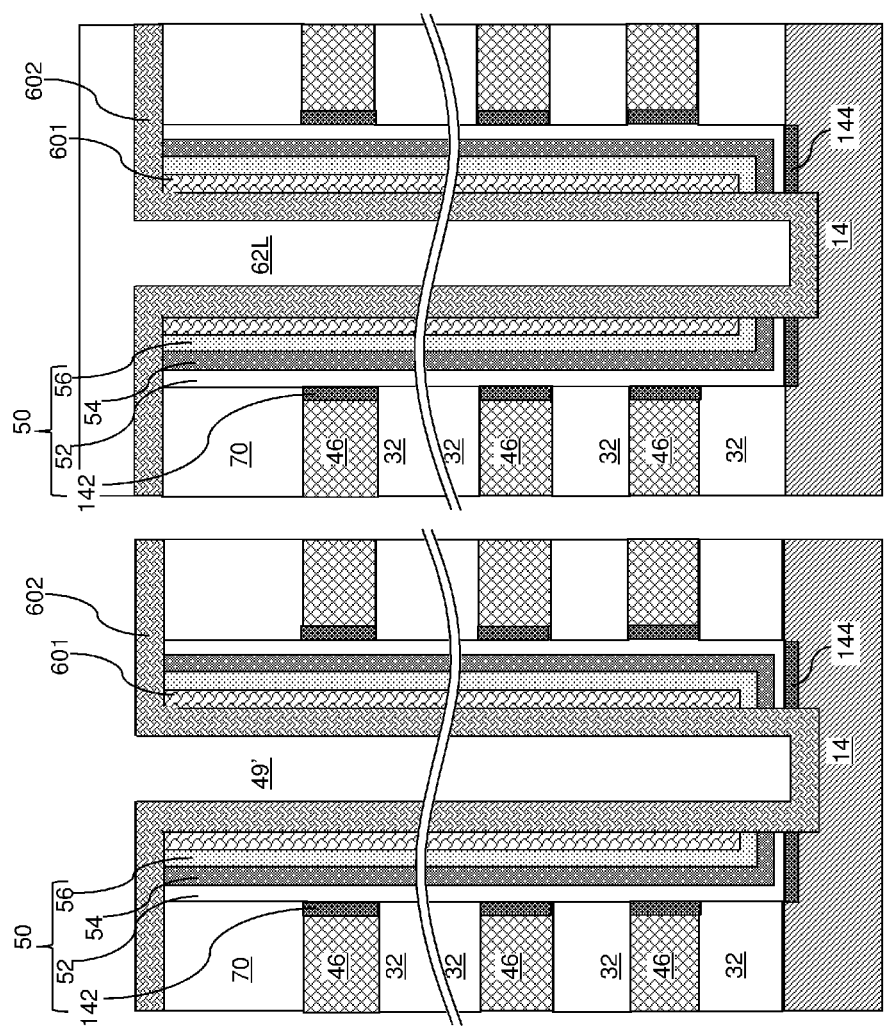

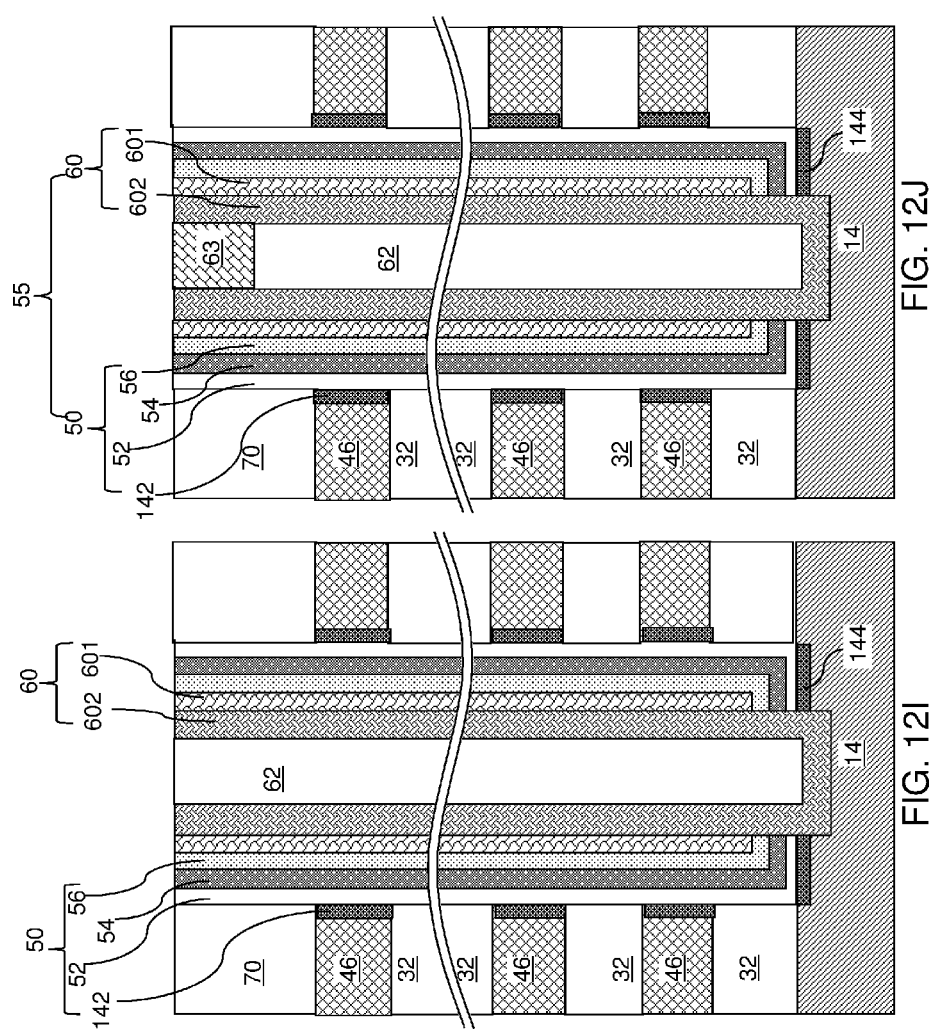

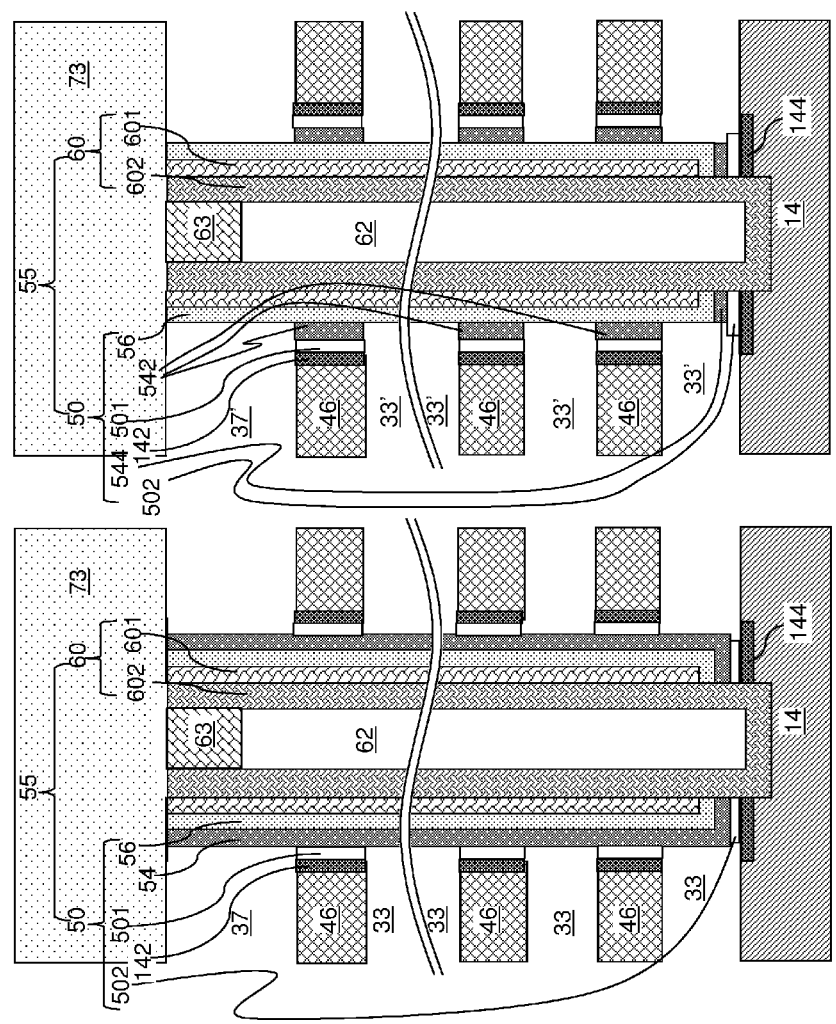

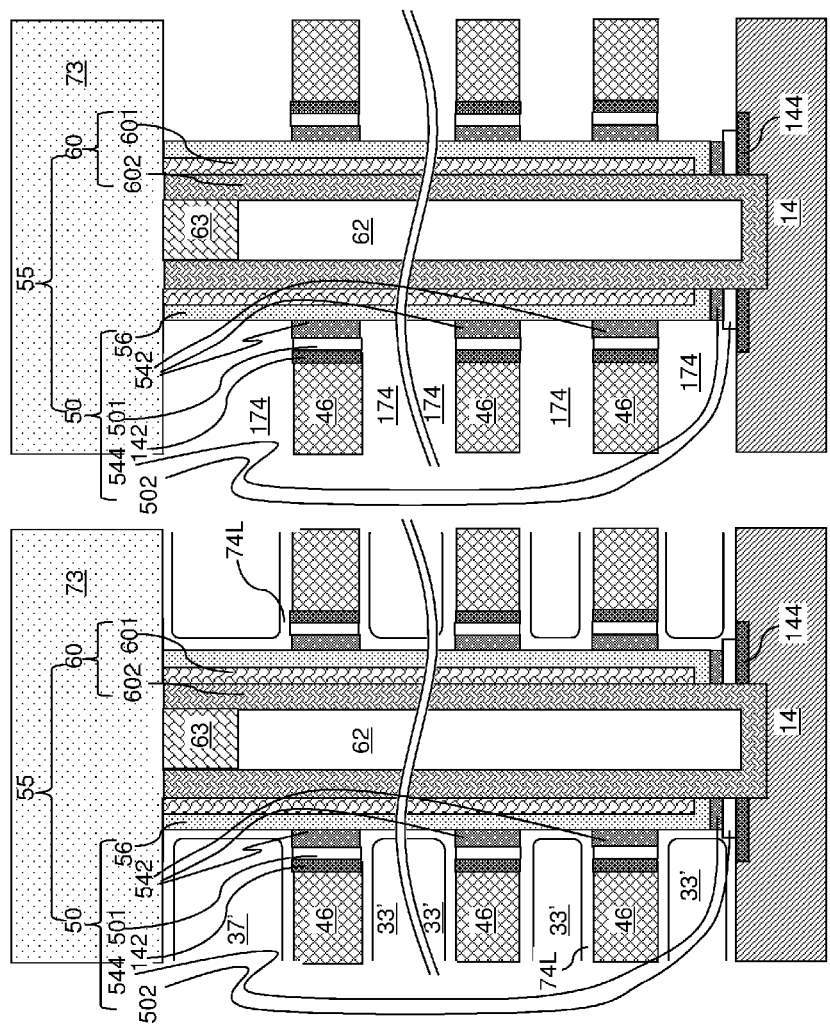

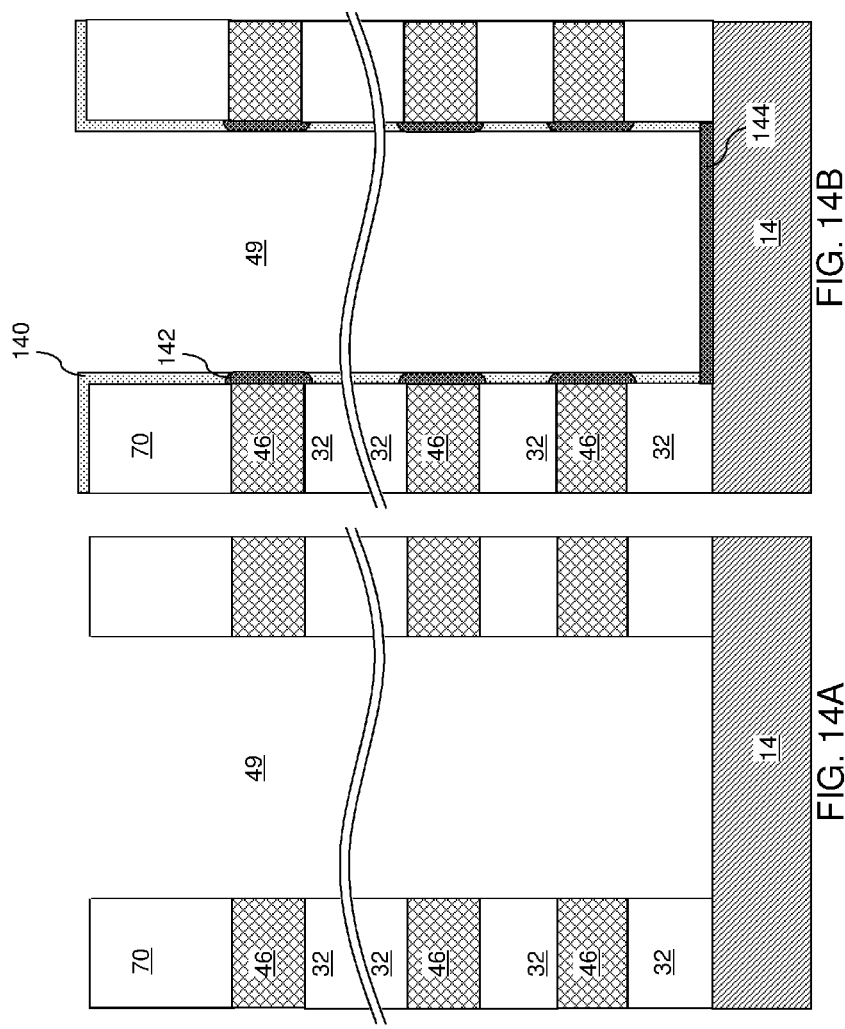

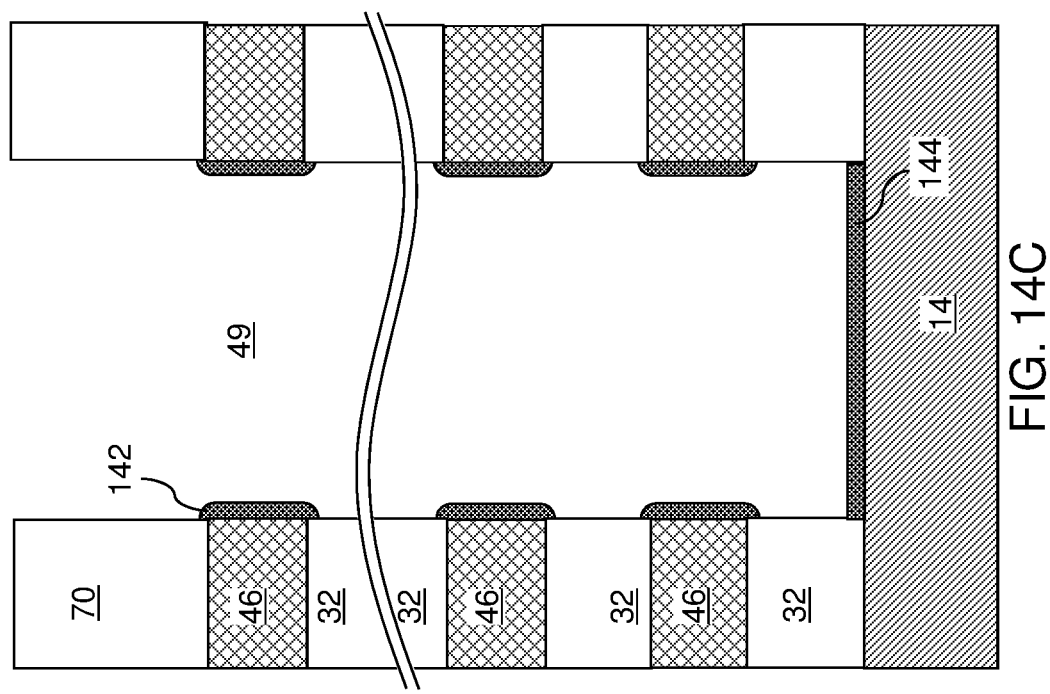

THREE-DIMENSIONAL MEMORY DEVICE WITH ANNULAR BLOCKING DIELECTRICS AND DISCRETE CHARGE STORAGE ELEMENTS AND METHOD OF MAKING THEREOF

FIELD

The present disclosure relates generally to the field of semiconductor devices, and particular to a three-dimensional memory device employing annular blocking dielectrics and discrete charge storage elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel contacting an inner sidewall of the memory film. The memory film comprises, from inside to outside: a tunneling dielectric layer that vertically extends through the alternating stack; and discrete annular structures located at each level of the electrically conductive layers, wherein each one of the nested annular structures includes, from inside to outside, an annular charge storage structure, and an annular dielectric metal oxide structure.

According to another aspect of the present disclosure, a method of forming a three-dimensional memory device is provided. An alternating stack of sacrificial material layers and electrically conductive layers is formed over a substrate. A memory opening is formed through the alternating stack. Annular dielectric metal oxide structures are formed on sidewalls of the electrically conductive layers around the memory opening. The annular dielectric metal oxide structures are vertically spaced from one another. A charge storage material layer, a tunneling dielectric layer, and a vertical semiconductor channel are formed inside the annular dielectric metal oxide structures in a remaining volume of the memory opening. Lateral recesses are formed by removing the sacrificial material layers selective to the electrically conductive layers. The charge storage material layer is etched at levels of the lateral recesses to form annular charge storage structures.

BRIEF DESCRIPTION OF THE DRAWINGS

FIGS. 5A-5J are sequential schematic vertical cross-sectional views of a memory opening within the first exemplary structure during formation of a memory stack structure, a dielectric core, and a drain region therein according to the first embodiment of the present disclosure.

FIG. 7B is a partial see-through top-down view of the first exemplary structure of FIG. 7A. The vertical plane A-A' is the plane of the schematic vertical cross-sectional view of FIG. 7A.

FIGS. 9A-9C are sequential vertical cross-sectional views of a region around a memory stack structure of the first exemplary structure during formation of insulating layers according to the first embodiment of the present disclosure.

FIG. 9D is a vertical cross-sectional view of a region around a memory stack structure of an alternative embodiment of the first exemplary structure according to the first embodiment of the present disclosure.

FIG. 11B is a top-down view of the first exemplary structure of FIG. 11A. The vertical plane A-A' is the plane of the schematic vertical cross-sectional view of FIG. 11A.

FIGS. 12A-12J are sequential schematic vertical cross-sectional views of a memory opening within a second exemplary structure during formation of a memory stack structure, a dielectric core, and a drain region therein according to a second embodiment of the present disclosure.

FIGS. 13A-13C are sequential vertical cross-sectional views of a region around a memory stack structure of the second exemplary structure during formation of insulating layers according to the second embodiment of the present disclosure.

FIG. 13D is a vertical cross-sectional view of a region around a memory stack structure of an alternative embodiment of the second exemplary structure according to the second embodiment of the present disclosure.

FIG. 14A-14C is a sequential vertical cross-sectional views of a memory opening within a third exemplary structure during formation of annular dielectric metal oxide structures according to a third embodiment of the present disclosure.

DETAILED DESCRIPTION

Figure 1:
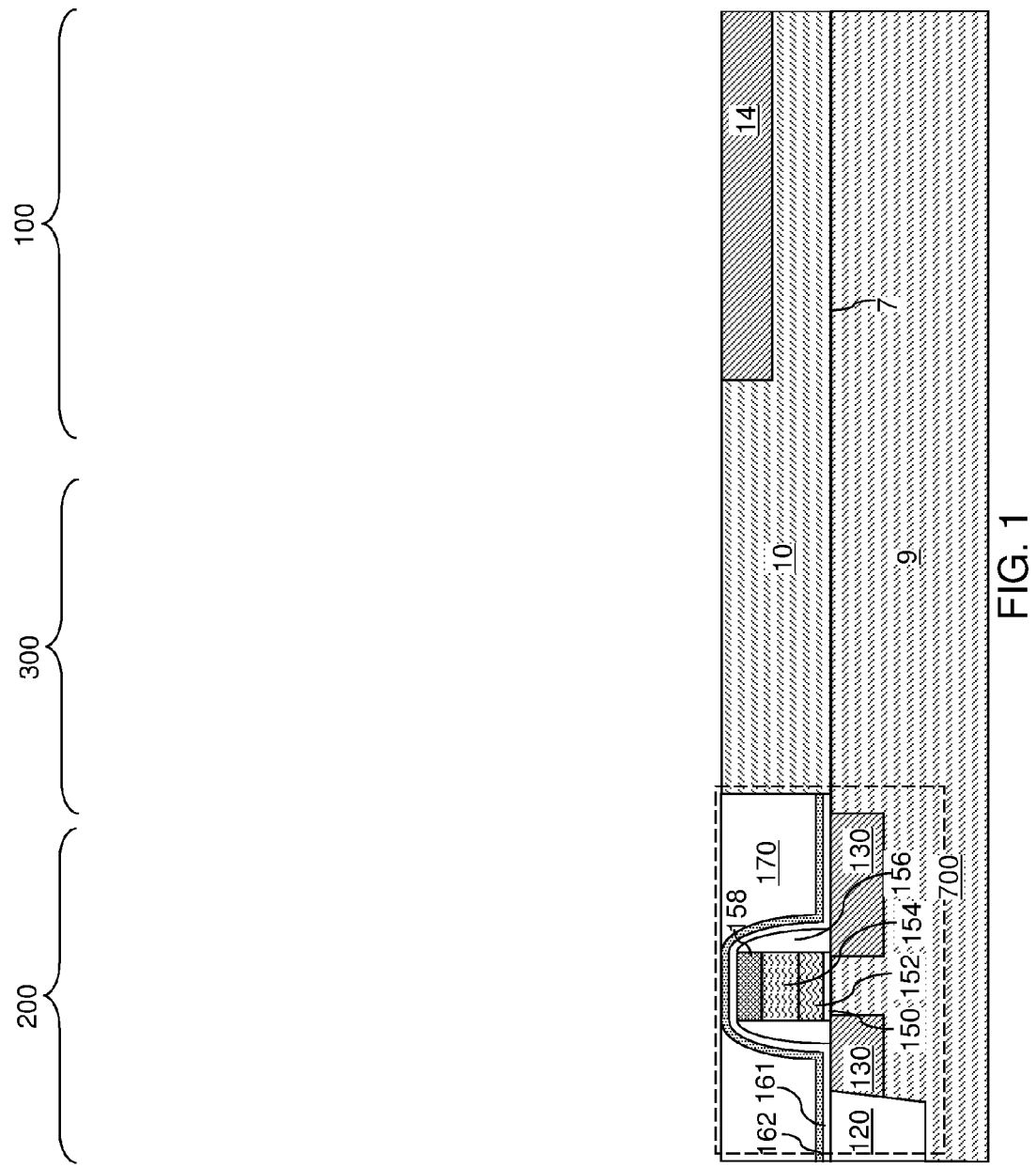
FIG. 1 is a schematic vertical cross-sectional view of a first exemplary structure after formation of at least one peripheral device, a semiconductor material layer, and an optional buried source layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer (not shown) can be formed above the semiconductor material layer 10 and the planarization dielectric layer 170. The gate dielectric layer can be, for example, silicon oxide layer. The thickness of the gate dielectric layer can be in a range from 3 nm to 30 nm, although lesser and greater thicknesses can also be employed.

An optional buried source layer 14 can be formed in an upper portion of the semiconductor substrate (9, 10), for example, by implantation of electrical dopants. If the semiconductor material layer 10 is present, the buried source layer 14 can be formed within an upper portion of the semiconductor material layer 10. If the semiconductor material layer 10 is not present, the buried source layer 14 can be formed in an upper portion of the substrate semiconductor layer 9. The conductivity type of the buried source layer 14 may be different from, the conductivity type of the semiconductor material layer 10. The buried source layer 14 can be formed by ion implantation employing a patterned mask. Alternatively, the buried source layer 14 can be omitted and a source region implanted into the semiconductor material layer 10 at a later step, as described below and as shown in FIG. 11C.

Figure 2:
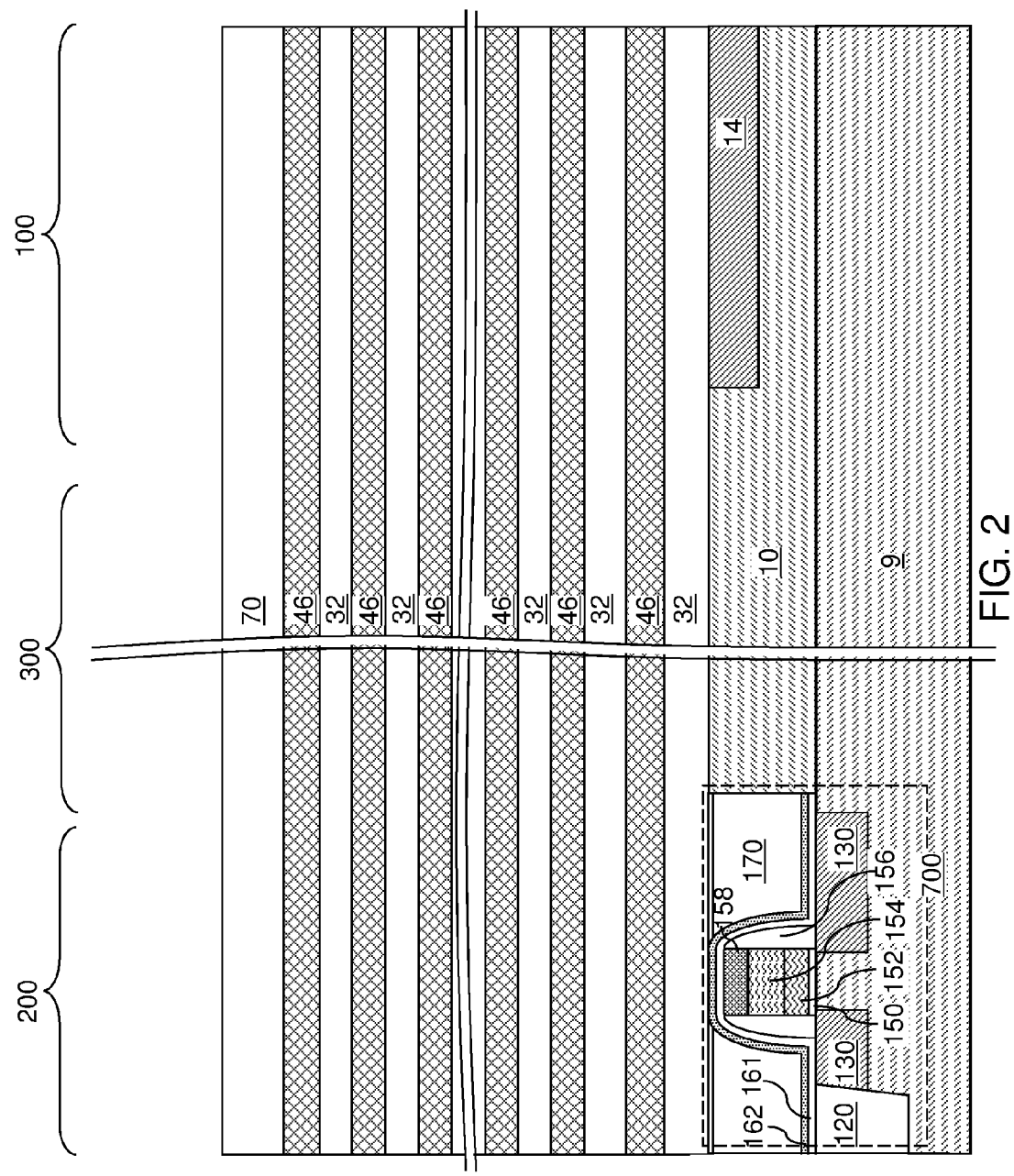
FIG. 2 is a schematic vertical cross-sectional view of the first exemplary structure after formation of an alternating stack of sacrificial material layers and electrically conductive layers according to the first embodiment of the present disclosure.

Referring to FIG. 2, a stack of an alternating plurality of first material layers (which can be sacrificial material layers 32) and second material layers (which can be electrically conductive layer 46) is formed over the top surface of the substrate. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be a sacrificial material layer 32, and each second material layer can be an electrically conductive layer 46. In this case, the stack can include an alternating plurality of sacrificial material layers 32 and electrically conductive layers 46, and constitutes a prototype stack of alternating layers comprising sacrificial material layers 32 and electrically conductive layers 46. As used herein, a "prototype" structure or an "in-process" structure refers to a transient structure that is subsequently modified in the shape or composition of at least one component therein.

The stack of the alternating plurality is herein referred to as an alternating stack (32, 46). In one embodiment, the alternating stack (32, 46) can include sacrificial material layers 32 composed of the first material, and electrically conductive layers 46 composed of a second material different from that of sacrificial material layers 32. In one embodiment, each sacrificial material layers 32 can consist essentially of the first material, and each electrically conductive layers 46 can consist essentially of at least one second material different from the first material of the sacrificial material layers 32.

The first material of the sacrificial material layers 32 can be a material that can be removed selective to the second material of the electrically conductive layers 46. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. An insulating material or a semiconductor material can be employed for the sacrificial material layers 32. Insulating materials that can be employed for the sacrificial material layers 32 include, but are not limited to, silicon oxide (including doped or undoped silicate glass), silicon nitride, silicon oxynitride, organosilicate glass (OSG), spin-on dielectric materials, dielectric metal oxynitrides and silicates thereof, and organic insulating materials. Semiconductor materials that can be employed for the sacrificial material layers 32 include, for example, polysilicon, amorphous silicon, a silicon-germanium alloy, a silicon-carbon alloy, a silicon-germanium-carbon alloy, a III-V compound semiconductor material, and an organic semiconductor material. In one embodiment, the first material of the sacrificial material layers 32 can be doped silicate glass such as borosilicate glass.

The second material of the electrically conductive layers 46 is an electrically conductive material. The electrically conductive layers 46 can comprise at least one metallic material and/or at least one conductive semiconductor material, i.e., at least one doped semiconductor material having electrical conductivity greater than $1.0 \times 10^5$ S/cm. Non-limiting examples of the second material include a metallic element such as W, Co, Mo, Ru, Al, or Cu. In one embodiment, the electrically conductive layers 46 can consist essentially of a single metallic element such as W, Co, Mo, Ru, Al, or Cu, or can consist essentially of an intermetallic alloy consisting essentially of at least two metallic elements. In another embodiment, a conductive metallic nitride material such as TiN, TaN, WN, TiC, TaC, or WC can be employed in conjunction with a conductive metal such as W, Co, Mo, Ru, Al, or Cu. In this case, each electrically conductive layer 46 can include a layer stack, from bottom to top, of a conductive metallic nitride material layer and a metal layer. In this case, each electrically conductive layer 46 can include two or more conductive metallic materials. In one embodiment, the electrically conductive layers 46 can include tungsten (W).

The thicknesses of the sacrificial material layers 32 and the electrically conductive layers 46 can be in a range from 20 nm to 50 nm, although lesser and greater thicknesses can be employed for each sacrificial material layer 32 and for each electrically conductive layer 46. The number of repetitions of the pairs of a sacrificial material layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each electrically conductive layer 46 in the alternating stack (32, 46) can have a uniform thickness that is substantially invariant within each respective electrically conductive layer 46.

Optionally, a sacrificial cap layer 70 can be formed over the alternating stack (32, 46). The sacrificial cap layer 70 includes a dielectric material that is different from the material of the electrically conductive layers 46. In one embodiment, the sacrificial cap layer 70 can include a dielectric material that can be employed for the sacrificial material layers 32 as described above. The sacrificial cap layer 70 can have a greater thickness than each of the sacrificial material layers 32. The sacrificial cap layer 70 can be deposited, for example, by chemical vapor deposition. In one embodiment, the sacrificial cap layer 70 can be a silicon oxide layer.

Figure 3:
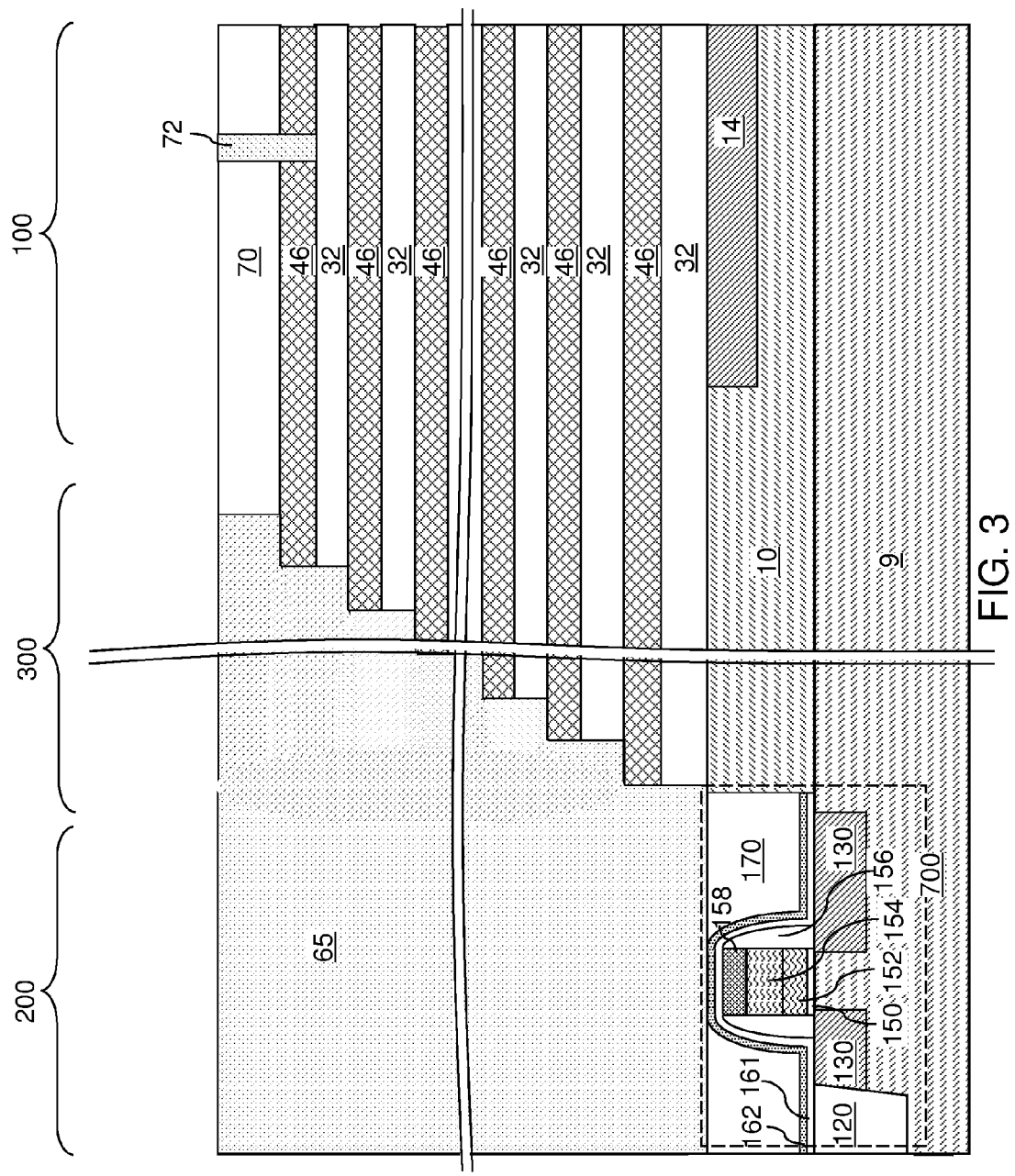
FIG. 3 is a schematic vertical cross-sectional view of the first exemplary structure after formation of stepped terraces, a retro-stepped dielectric material portion, and a drain select level separator structure according to the first embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 46) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 46). Each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). Each electrically conductive layer 46 other than the topmost electrically conductive layer 46 within the alternating stack (32, 46) laterally extends farther than any overlying electrically conductive layer 46 within the alternating stack (32, 46).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the sacrificial cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the sacrificial cap layer 70 and a subset of the electrically conductive layers 46 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the sacrificial cap layer 70.

Figure 4A:
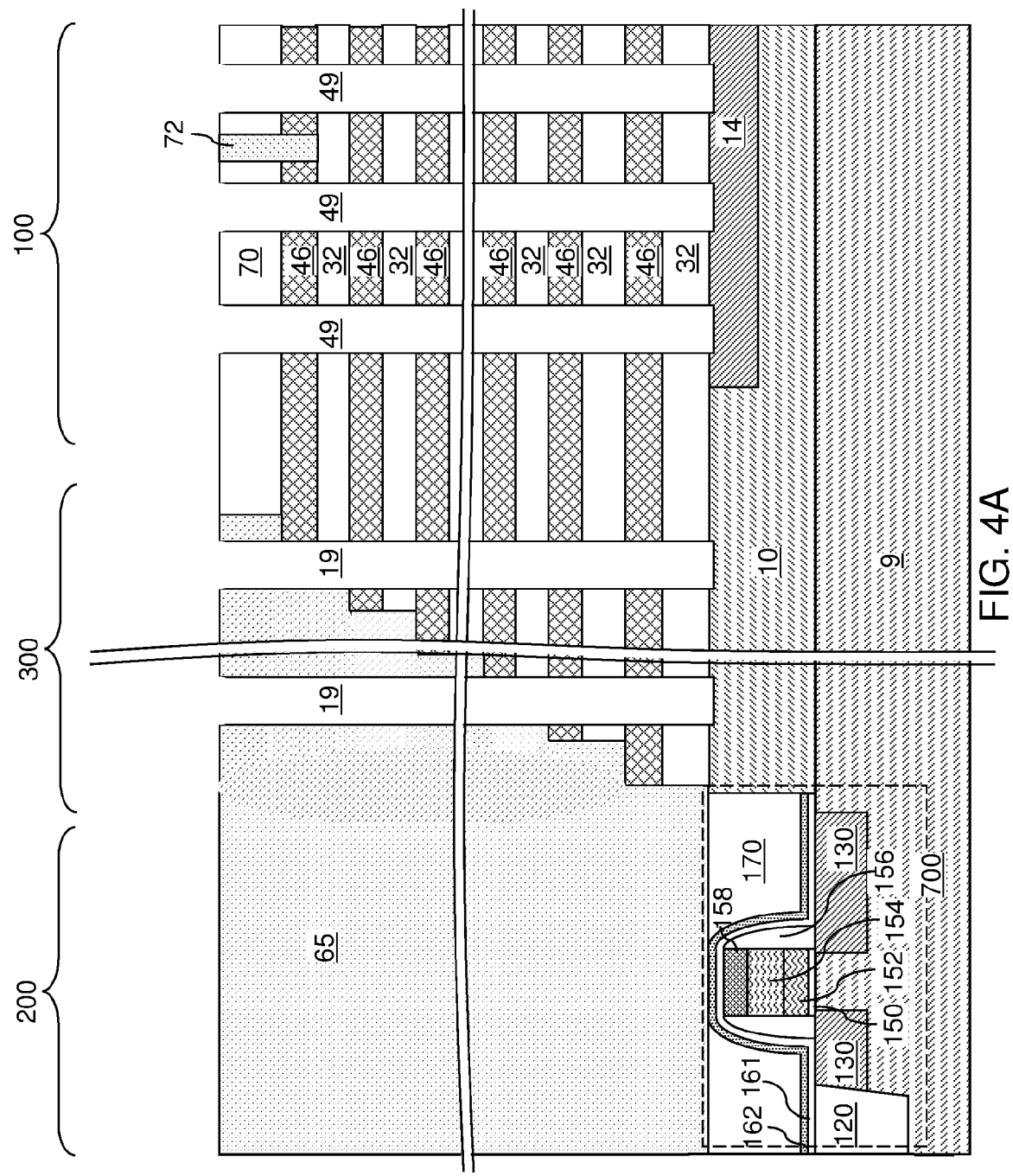
FIG. 4A is a schematic vertical cross-sectional view of the first exemplary structure after formation of memory openings and support openings according to the first embodiment of the present disclosure.
Figure 4B:
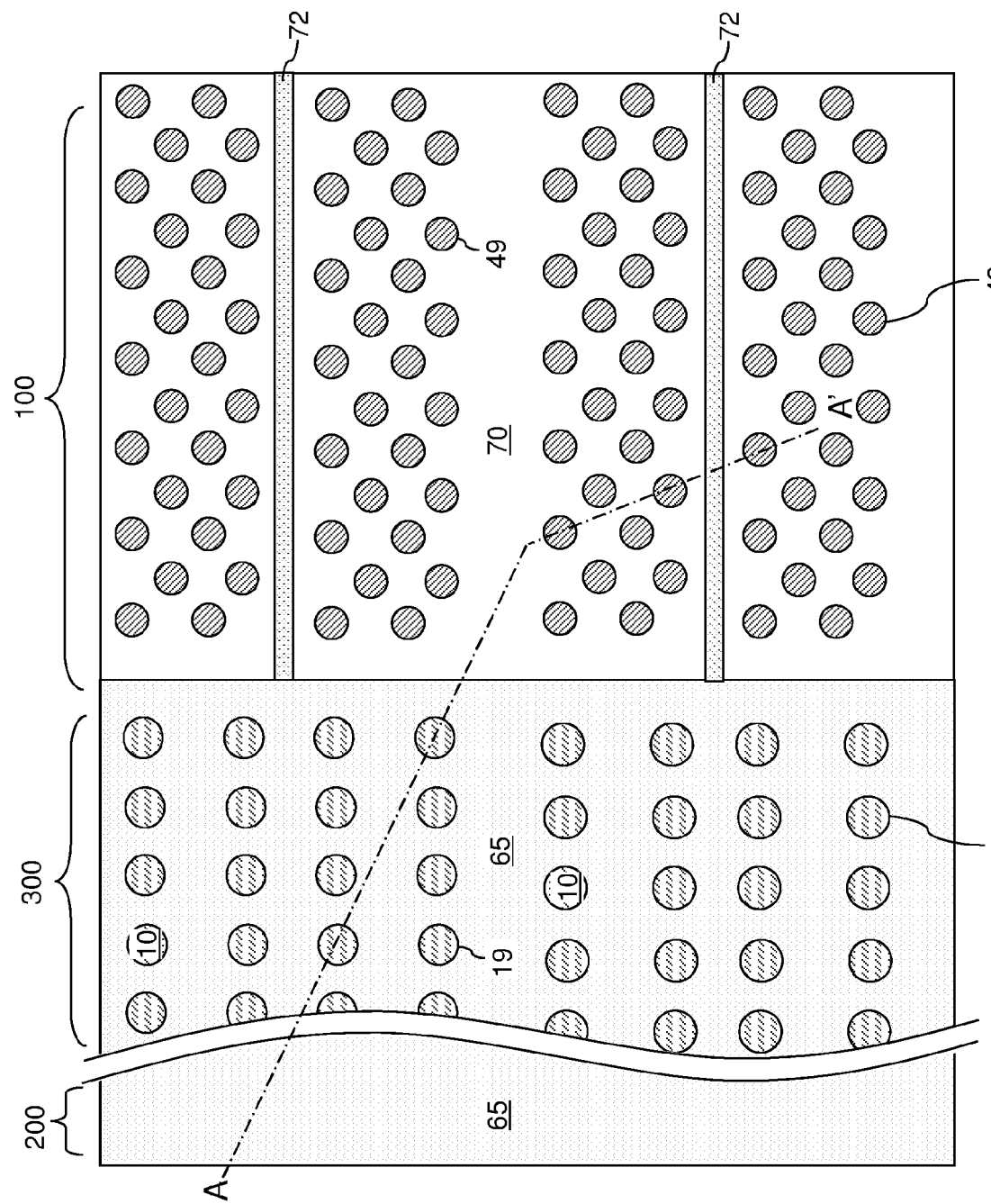
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the sacrificial cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the sacrificial cap layer 70 or the retro-stepped dielectric material portion 65, and through the alternating stack (32, 46) by at least one anisotropic etch that employs the patterned lithographic material stack as an etch mask. Portions of the alternating stack (32, 46) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the sacrificial cap layer 70 and the entirety of the alternating stack (32, 46) in the memory array region 100. The support openings 19 are formed through the retro-stepped dielectric material portion 65 and the portion of the alternating stack (32, 46) that underlie the stepped surfaces in the contact region 300.

The memory openings 49 extend through the entirety of the alternating stack (32, 46). The support openings 19 extend through a subset of layers within the alternating stack (32, 46). The chemistry of the anisotropic etch process employed to etch through the materials of the alternating stack (32, 46) can alternate to optimize etching of the first and second materials in the alternating stack (32, 46). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 46) to at least the horizontal plane including the topmost surface of the optional buried source layer 14 (if present) or of the semiconductor material layer 10 if the buried source layer 14 is omitted. In one embodiment, an overetch into the buried source layer 14 (if present) or the semiconductor material layer 10 if the buried source layer 14 is omitted may be optionally performed after the top surface of the buried source layer 14 or the semiconductor material layer 10 is physically exposed at a bottom of each memory opening 49 and each support opening 19. The overetch may be performed prior to, or after, removal of the lithographic material stack. In other words, the recessed surfaces of the buried source layer 14 or the semiconductor material layer 10 may be vertically offset from the un-recessed top surfaces of the buried source layer 14 or the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the buried source layer 14 or the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J schematically illustrate a process for forming a memory stack structure, a dielectric core, and a drain region within each of the memory openings 49 and the support openings 19.

Referring to FIG. 5A, a memory opening 49 in the exemplary device structure of FIGS. 4A and 4B is illustrated. The memory opening 49 extends through the sacrificial cap layer 70, the alternating stack (32, 46), and optionally into an upper portion of the buried source layer 14 or the semiconductor material layer 10. At this processing step, each support opening 19 can extend through the retro-stepped dielectric material portion 65, a subset of layers in the alternating stack (32, 46), and optionally through the upper portion of the semiconductor material layer 10. The recess depth of the bottom surface of each memory opening with respect to the top surface of the buried source layer 14 or the semiconductor material layer 10 can be in a range from 0 nm to 30 nm, although greater recess depths can also be employed. Optionally, the electrically conductive layers 46 can be laterally recessed partially to form lateral recesses (not shown), for example, by an isotropic etch.

Referring to FIG. 5B, a metal can be selectively deposited on the physically exposed surfaces of the electrically conductive layers 46 while deposition of the metal on surfaces of the sacrificial material layers does not occur (e.g., is suppressed). Any suitable metal that can be selectively deposited on the surfaces of the electrically conductive layers 46 without growing from physically exposed surfaces of the sacrificial material layers 32 and which forms a dielectric oxide (i.e., electrically insulating oxide) upon oxidation may be used.

For example, the metal can be aluminum deposited by chemical vapor deposition or atomic layer deposition employing an aluminum-containing precursor. Exemplary precursors for depositing aluminum in chemical vapor deposition or atomic layer deposition include, but are not limited to, aluminum tris(2,2,6,6-tetramethyl-3,5-heptanedionate), triisobutylaluminum, trimethylaluminum, trimethylaluminum, and tris(dimethylamido)aluminum(III). In an exemplary embodiment, the electrically conductive layers 46 can include a metal such as W, Co, Mo or Ru, and the sacrificial material layers 32 can include a dielectric material such as silicon oxide, and the difference in electrical conductivities of surfaces can be a driving mechanism for inducing deposition of aluminum on the surfaces of the electrically conductive layers 46 while deposition of aluminum is suppressed on the surfaces of the sacrificial material layers 32. The mechanism of selective aluminum growth is illustrated, for example, in Tsubouchi, Kazuo, "Selective Aluminum Chemical Vapor deposition," Journal of Vacuum Science & Technology: Vacuum, Surfaces, and Films 10.4 (1992); 856, which is incorporated herein by reference.

While aluminum is described as an exemplary species, it is understood that any metal that can be deposited selectively on the physically exposed surfaces of the electrically conductive layers 46 while suppressing growth from the sacrificial material layers 32 and can be subsequently converted into a dielectric metal oxide may be employed.

Selective deposition of the metal forms annular metal structures 141. As used herein, an "annular" structure refers to any structure that is topologically homeomorphic to a torus, i.e. a structure that can be converted into a torus by a continuous change of shape without destruction or creation of any hole. Thus, an annular structure includes only a single hole therein. The outer sidewall of each annular metal structure 141 contacts a sidewall of a respective electrically conductive layer 46 that laterally encircles a respective memory opening 49 or a support opening. As used herein, a first element "laterally encircles" a second element if the second element continuously extends around an entire circumference of the first element. The thickness of each annular metal structure 141, as measured between an inner sidewall and the outer sidewall of the annular metal structure 141, can be in a range from 1 nm to 10 nm, although lesser and greater thicknesses can also be employed. In some embodiment, a metal plate 143 can be deposited on the physically exposed surface of the buried source layer 14 or the semiconductor material layer 10 at the bottom of each memory opening 49 and on the physically exposed surface of semiconductor material layer 10 at the bottom of each support opening 19.

Referring to FIG. 5C, an oxidation process is performed to convert the annular metal structures 141 into annular dielectric metal oxide structures 142. For example, if the annular metal structures 141 comprise aluminum, then the annular dielectric metal oxide structures 142 may comprise aluminum oxide. If metal plates 143 are present at the bottom of the memory openings 49 and the support openings 19, the metal plates 143 can be converted into dielectric metal oxide plates 144. The oxidation process can be a thermal oxidation process or a plasma oxidation process. In case of a thermal oxidation process, an oxidizing gas such as oxygen is supplied while the first exemplary structure is subjected to an elevated temperature, which may be in a range from 600° C. to 1,050° C. In case of a plasma oxidation, a plasma of an oxidizing gas (such as $O_2$ or $O_3$) can be employed. The thickness of the annular dielectric metal oxide structures 142 and the dielectric metal oxide plates 144 may be in a range from 1.2 nm to 15 nm, such as from 2 nm to 6 nm, although lesser and greater thicknesses can also be employed.

Alternatively, in case the electrically conductive layers 46 include a material (such as aluminum) that can form a dielectric metal oxide, the processing steps of FIG. 5B can be omitted, and the annular dielectric metal oxide structures 142 (e.g., aluminum oxide structures) can be formed by oxidation of surface portions of the electrically conductive layers 46 around each memory opening 49 and around each support opening 19. In this case, the dielectric metal oxide plates 144 can be replaced with dielectric semiconductor oxide plates. The dielectric metal oxide plate 144 can be formed on a top surface of the semiconductor substrate (9, 10) underneath each memory opening 49 and underneath each support opening 19 concurrently with formation of the annular dielectric metal oxide structures 142.

The annular dielectric metal oxide structures 142 are formed on sidewalls of the electrically conductive layers 46 around each memory opening 49 and around each support opening 19. The annular dielectric metal oxide structures 142 are formed only at the levels of the electrically conductive layers 46, and therefore, are vertically spaced from one another.

Referring to FIG. 5D, an optional silicon oxide layer 52 and a charge storage material layer 54 can be sequentially formed over the annular dielectric metal oxide structures 142 in the memory openings 49 and in the support openings 19. In one embodiment, the silicon oxide layer 52 can be formed by a conformal deposition method such as low pressure chemical vapor deposition, atomic layer deposition, or a combination thereof. The thickness of the silicon oxide layer 52 can be in a range from 1 nm to 20 nm, although lesser and greater thicknesses can also be employed.

The charge storage material layer 54 can be formed as a continuous layer of a dielectric charge trapping material, which can be, for example, silicon nitride. The charge storage material layer 54 can be formed as a single charge storage material layer of homogeneous composition, or can include a stack of multiple charge storage material layers. Alternatively, the charge storage material layer 54 may comprise conductive nanoparticles such as metal nanoparticles, which can be, for example, ruthenium nanoparticles. The charge storage material layer 54 can be formed, for example, by chemical vapor deposition (CVD), atomic layer deposition (ALD), physical vapor deposition (PVD), or any suitable deposition technique for storing electrical charges therein. The thickness of the charge storage material layer 54 can be in a range from 2 nm to 20 nm, although lesser and greater thicknesses can also be employed. A memory cavity 49' is present within each unfilled volume of the memory openings 49.

Figure 5F:
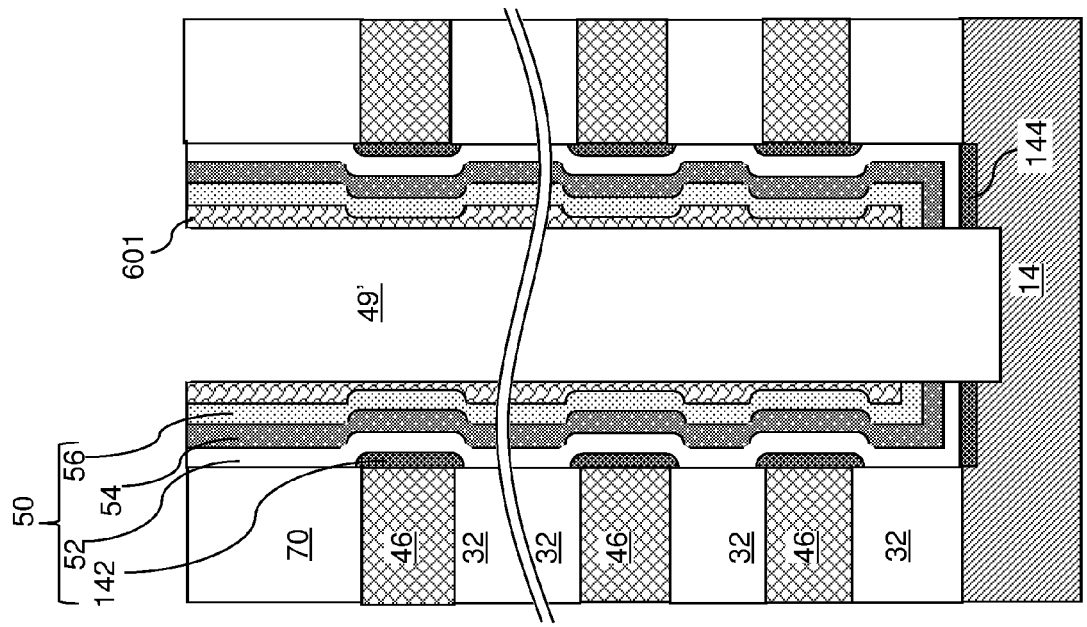
Figure 5E:
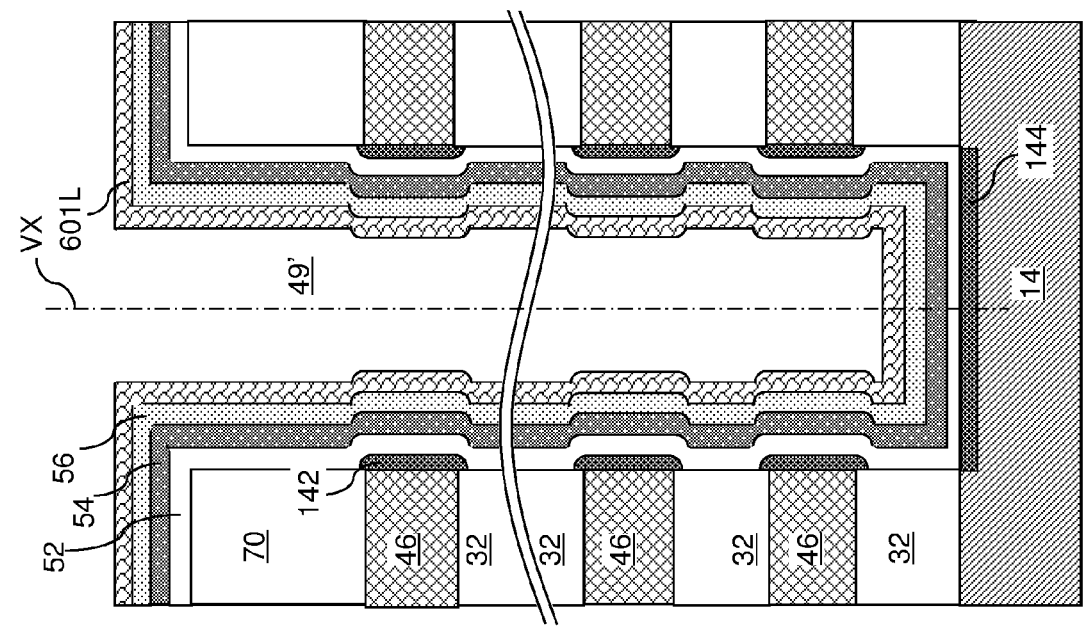

Referring to FIG. 5E, a tunneling dielectric layer 56 and a first semiconductor channel layer 601L are formed inside the annular dielectric metal oxide structures 142 and over the charge storage material layer 54 in the remaining volume of each memory opening 49 and each support opening 19. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (52, 54, 56, 601L).

Each of the silicon oxide layer 52, the charge storage material layer 54, the tunneling dielectric layer 56, and the first semiconductor channel layer 601L is formed with a respective radially undulating profile. As used herein, a "radially undulating profile" refers to a profile in which the radial distance of an inner surface or an outer surface of a structure from an axis undulates with a distance along an axial direction, i.e., the direction of the axis. Specifically, each of the silicon oxide layer 52, the charge storage material layer 54, the tunneling dielectric layer 56, and the first semiconductor channel layer 601L laterally protrudes farther outward from a vertical axis VX passing through a geometrical center of the memory opening 49 at levels of the sacrificial material layers 32 than at levels of the electrically conductive layers 46. As used herein, a geometrical center of an object refers to the center of mass of a hypothetical object having a uniform density throughout and having the same volume as the object.

Referring to FIG. 5F, the first semiconductor channel layer 601L, the tunneling dielectric layer 56, the charge storage material layer 54, the silicon oxide layer 52 are sequentially anisotropically etched employing at least one anisotropic etch process. The horizontal portions of the first semiconductor channel layer 601L, the tunneling dielectric layer 56, the charge storage material layer 54, and the silicon oxide layer 52 located above the top surface of the sacrificial cap layer 70 can be removed by the at least one anisotropic etch process. Further, the horizontal portions of the first semiconductor channel layer 601L, the tunneling dielectric layer 56, the charge storage material layer 54, and the silicon oxide layer 52 at a bottom of each memory cavity 49' can be removed to form openings in remaining portions thereof. Each of the first semiconductor channel layer 601L, the tunneling dielectric layer 56, the charge storage material layer 54, and the silicon oxide layer 52 can be etched by a respective anisotropic etch process employing a respective etch chemistry, which may, or may not, be the same for the various material layers. A center portion of the dielectric metal oxide plate 144 etched to form an opening therein.

Each remaining portion of the first semiconductor channel layer 601L is herein referred to as a first semiconductor channel 601, which can have a tubular configuration. In one embodiment, each first semiconductor channel 601 can have a substantially vertical inner sidewall without radial undulation, and can have a radially undulating outer sidewall. Each remaining portion of the charge storage material layer 54 can be topologically homeomorphic to a torus, and comprises a charge storage material or a floating gate material. In one embodiment, each charge storage material layer 54 can include a vertical stack of charge storage regions that store electrical charges upon programming. In one embodiment, the charge storage material layer 54 can be a charge storage material layer in which each portion adjacent to the electrically conductive layers 46 constitutes a charge storage region.

A surface of the buried source layer 14 or the semiconductor material layer 10 can be physically exposed underneath the opening through the first semiconductor channel 601, the tunneling dielectric layer 56, the charge storage material layer 54, and the silicon oxide layer 52. Optionally, the physically exposed semiconductor surface at the bottom of each memory cavity 49' can be vertically recessed so that the recessed semiconductor surface underneath the memory cavity 49' is vertically offset from the topmost surface of the buried source layer 14 or the semiconductor material layer 10 by a recess distance. A tunneling dielectric layer 56 is located over the charge storage material layer 54. A set of all dielectric metal oxide structures 142, a silicon oxide layer 52, a charge storage material layer 54, and a tunneling dielectric layer 56 in a memory opening 49 constitutes a memory film 50, which includes a plurality of charge storage regions (as embodied as the charge storage material layer 54) that are insulated from surrounding materials by the silicon oxide layer 52 and the tunneling dielectric layer 56. In one embodiment, the first semiconductor channel 601, the tunneling dielectric layer 56, the charge storage material layer 54, and the silicon oxide layer 52 can have vertically coincident sidewalls at the bottom of the memory opening 49. As used herein, multiple elements can have "vertically coincident sidewalls" if the sidewalls of the multiple elements overlie or underlie one another and are within a common vertical plane.

Referring to FIG. 5G, a second semiconductor channel layer 602L can be deposited directly on the semiconductor surface of the buried source layer 14 and directly on each first semiconductor channel 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the memory cavity 49' in each memory opening, or may fully fill the cavity in each memory opening.

The materials of the first semiconductor channel 601 and the second semiconductor channel layer 602L are collectively referred to as a semiconductor channel material. In other words, the semiconductor channel material is a set of all semiconductor material in the first semiconductor channel 601 and the second semiconductor channel layer 602L.

Referring to FIG. 5H, in case the memory cavity 49' in each memory opening is not completely filled by the second semiconductor channel layer 602L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5J:
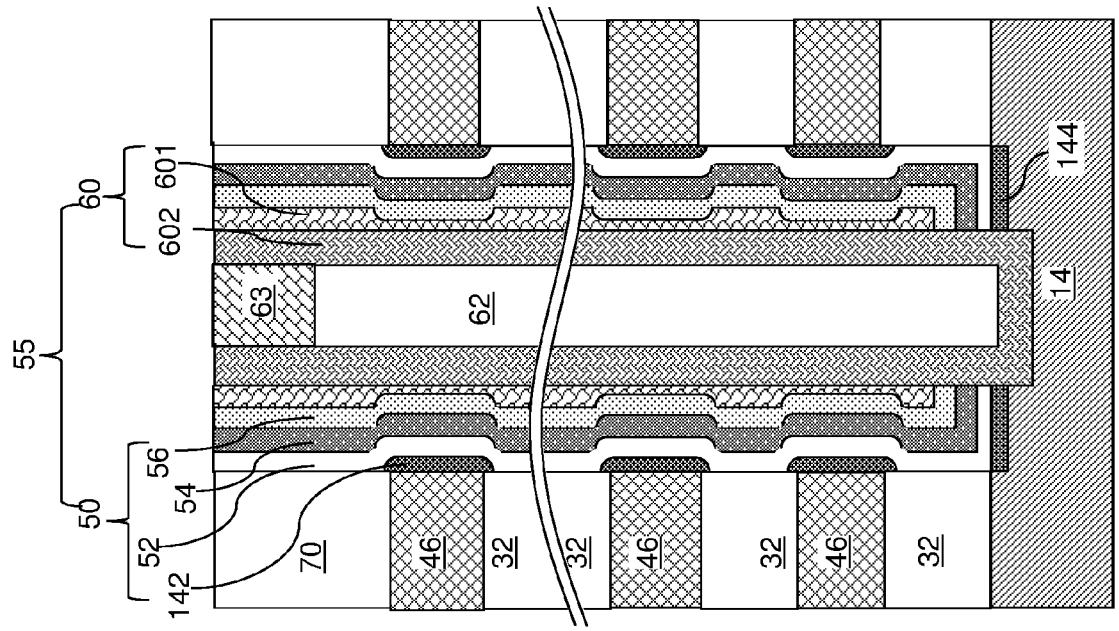
Figure 5I:
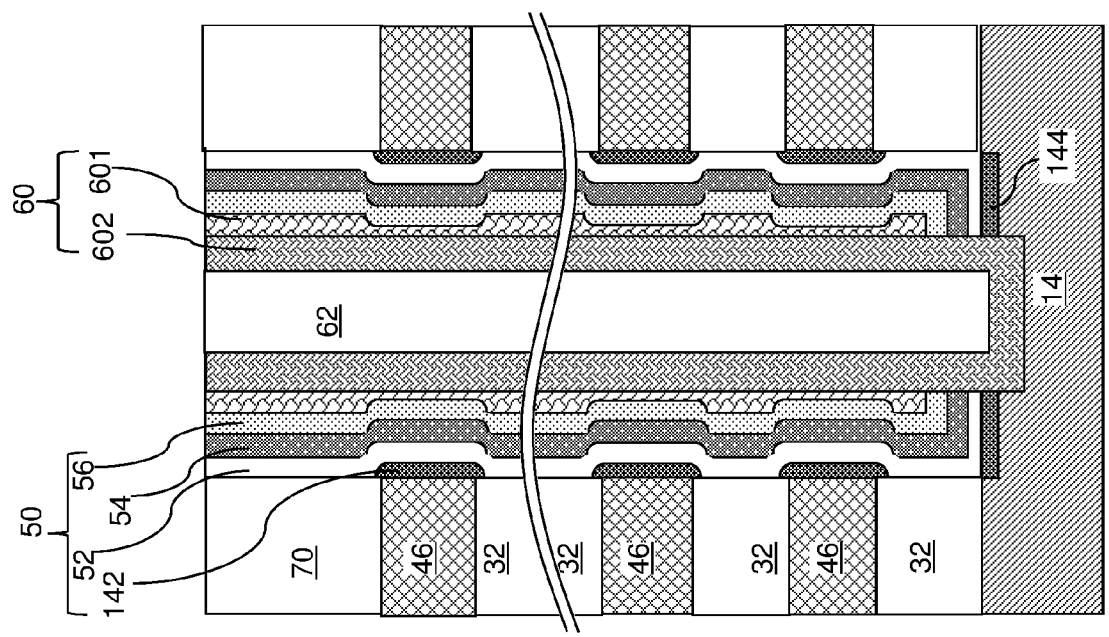

Referring to FIG. 5I, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L constitutes a second semiconductor channel 602, which can be located entirely within a memory opening 49 or entirely within a support opening 19.

Each adjoining pair of a first semiconductor channel 601 and a second semiconductor channel 602 can collectively form a vertical semiconductor channel 60 through which electrical current can flow when a vertical NAND device including the vertical semiconductor channel 60 is turned on. A tunneling dielectric layer 56 is surrounded by a charge storage material layer 54, and laterally surrounds a portion of the vertical semiconductor channel 60. Each adjoining set of a silicon oxide layer 52, a charge storage material layer 54, and a tunneling dielectric layer 56 collectively constitute a memory film 50, which can store electrical charges with a macroscopic retention time. The annular dielectric metal oxide structures 142 may comprise portions of the blocking dielectric (52, 142) and thus may also comprise a portion of the memory film 50. In some embodiments, a silicon oxide layer 52 may not be present in the memory film 50 at this step, and the blocking dielectric is composed of only the annular dielectric metal oxide structures 142. As used herein, a macroscopic retention time refers to a retention time suitable for operation of a memory device as a permanent memory device such as a retention time in excess of 24 hours.

Referring to FIG. 5J, the top surface of each dielectric core 62 can be further recessed within each memory opening, for example, by a recess etch to a depth that is located between the top surface of the sacrificial cap layer 70 and the bottom surface of the sacrificial cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the sacrificial cap layer 70, for example, by chemical mechanical planarization (CMP) or a recess etch to form the drain regions 63. Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage material layer 54 and annular dielectric metal oxide portions 142, and an optional silicon oxide layer 52.

Each combination of a dielectric metal oxide plate 144 (or a semiconductor oxide plate), a memory stack structure 55, a dielectric core 62, and a drain region 63 within a memory opening 49 is herein referred to as a memory opening fill structure (144, 55, 62, 63). Each combination of a dielectric metal oxide plate 144 (or a semiconductor oxide plate), a memory film 50, a vertical semiconductor channel 60, a dielectric core 62, and a drain region 63 within each support opening 19 fills the respective support openings 19, and constitutes a support pillar structure 20 (shown in FIG. 6).

Figure 6:
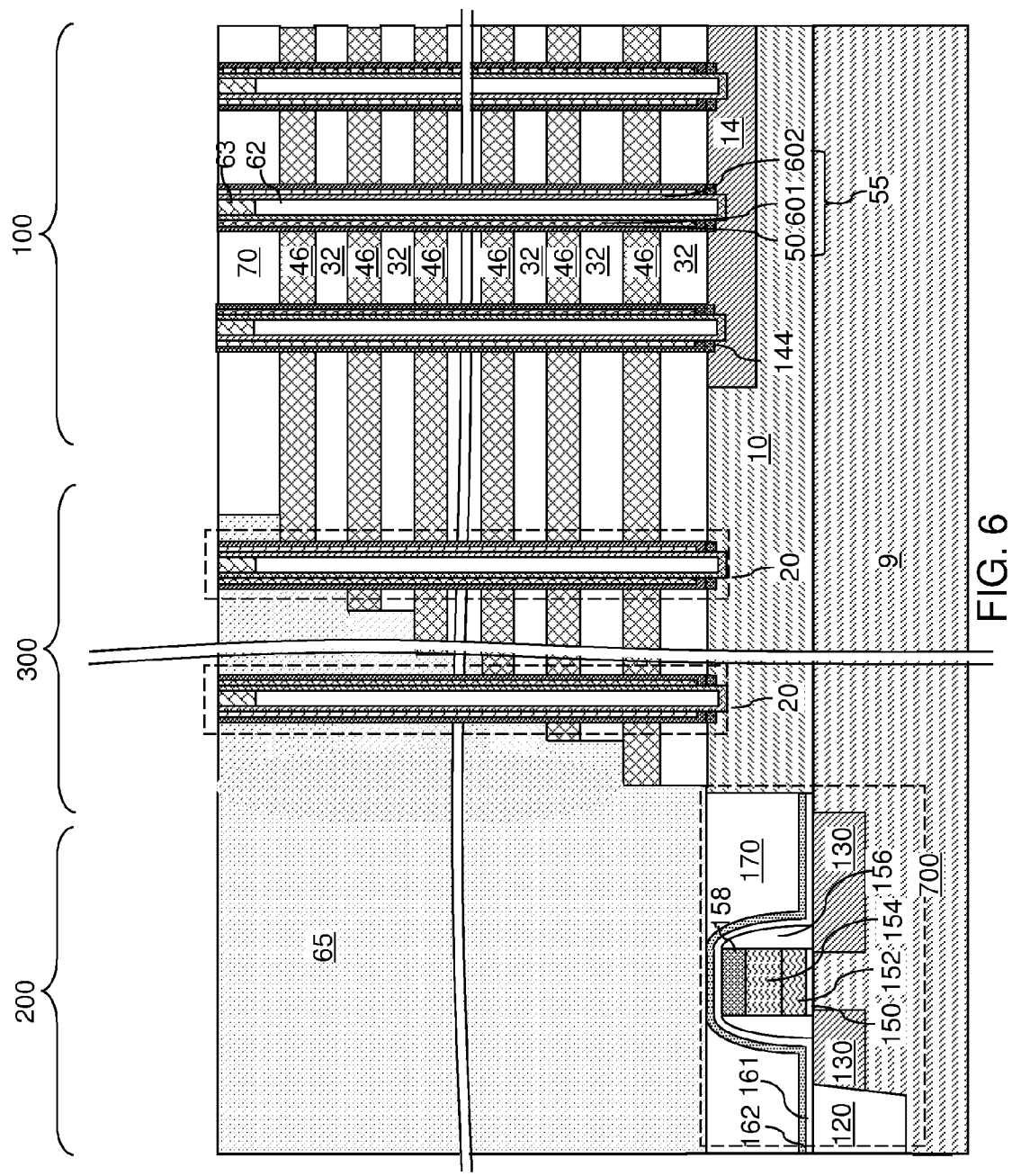
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures (144, 55, 62, 63) and support pillar structure 20 within the memory openings 49 and the support openings 19, respectively. Due to the expanded scale of FIG. 6, the discrete regions 54, 142 of FIG. 5J are not shown in FIG. 6. An instance of a memory opening fill structure (144, 55, 62, 63) can be formed within each memory opening 49 of the structure of FIGS. 4A and 4B. An instance of the support pillar structure 20 can be formed within each support opening 19 of the structure of FIGS. 4A and 4B. Each support pillar structure 20 can be a dummy structure that is not electrically active. For example, the entire top surface of each drain region 63 of the support pillar structures 20 can be contacted by a dielectric material (such as a contact level dielectric layer to be subsequently formed) and not contacted by any conductive structure to ensure that the support pillar structures 20 are electrically isolated.

Figure 7A:
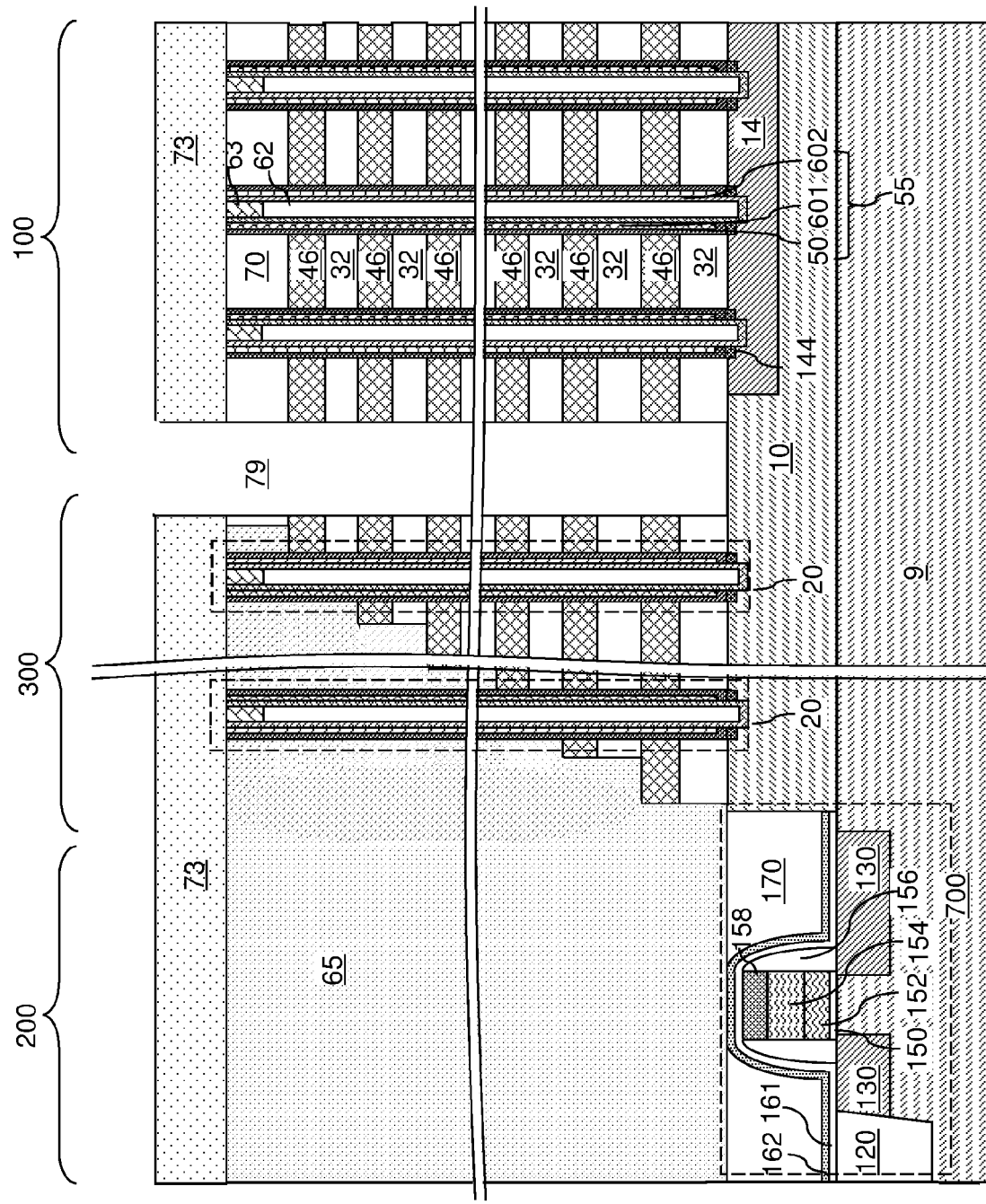
FIG. 7A is a schematic vertical cross-sectional view of the exemplary structure after formation of backside trenches according to the first embodiment of the present disclosure.

Referring to FIGS. 7A and 7B, a contact level dielectric layer 73 can be formed over the alternating stack (32, 46) of sacrificial material layer 32 and electrically conductive layers 46, and over the memory stack structures 55 and the support pillar structures 20. The contact level dielectric layer 73 includes a dielectric material that is different from the dielectric material of the sacrificial material layers 32 and the sacrificial cap layer 70. For example, the contact level dielectric layer 73 can include undoped silicate glass, silicon nitride, and/or a dielectric metal oxide, and the sacrificial material layers 32 and the sacrificial cap layer 70 can include a doped silicate glass (such as borosilicate glass) or organosilicate glass. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 46) and/or the retro-stepped dielectric material portion 65 employing an anisotropic etch to form backside trenches 79, which vertically extend from the top surface of the contact level dielectric layer 73 at least to the top surface of the semiconductor substrate (9, 10), and laterally extend through the memory array region 100 and the contact region 300. In one embodiment, the backside trenches 79 can include a source contact opening in which a source contact via structure can be subsequently formed if the buried source layer 14 is omitted. The photoresist layer can be removed, for example, by ashing.

Figure 8:
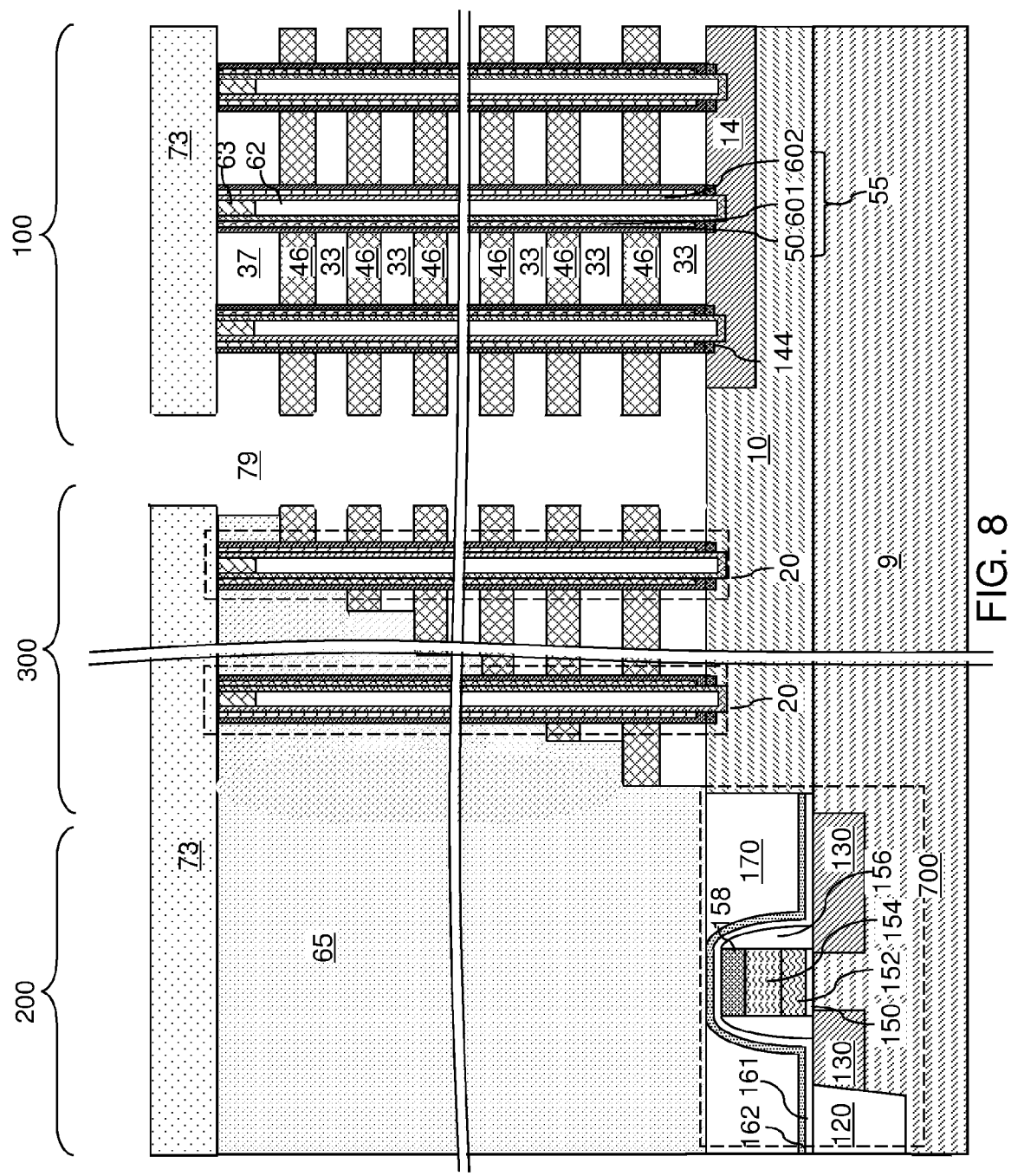
FIG. 8 is a schematic vertical cross-sectional view of the first exemplary structure after formation of backside recesses according to the first embodiment of the present disclosure.

Referring to FIG. 8, an etchant that selectively etches the first material of the sacrificial material layers 32 and the material of the sacrificial cap layer 70 (which can be the first material) with respect to the second material of the electrically conductive layers 46 can be introduced into the backside trenches 79, for example, employing an etch process. Backside recesses (33, 37) are formed in volumes from which the sacrificial material layer 32 and the sacrificial cap layer 70 are removed. The removal of the first material of the sacrificial material layers 32 and the material of the sacrificial cap layer 70 can be selective to the second material of the electrically conductive layers 46, the material of the retro-stepped dielectric material portion 65, the semiconductor material of the semiconductor material layer 10 and the buried source layer 14, and the material of the outermost layer of the memory films 50. In one embodiment, the sacrificial material layers 32 and the sacrificial cap layer 70 can include a doped silicate glass (such as borosilicate glass or another doped silicate glass providing a higher etch rate in HF) or an organosilicate glass, and the material of the retro-stepped dielectric material portion 65 can be selected from undoped silicon oxide having a lower etch rate in HF, silicon nitride, and dielectric metal oxides.

The etch process that removes the first material selective to the second material and the outermost layer of the memory films 50 can be a wet etch process employing a wet etch solution, or can be a gas phase (dry) etch process in which the etchant is introduced in a vapor phase into the backside trenches 79. For example, if the sacrificial material layer 32 and the sacrificial cap layer 70 include doped silicate glass or organosilicate glass, the etch process can be a hydrofluoric-acid based wet etch process in which the first exemplary structure is immersed within a hydrofluoric acid. The support pillar structure 20, the retro-stepped dielectric material portion 65, and the memory stack structures 55 provide structural support while the backside recesses (33, 37) are present within volumes previously occupied by the sacrificial material layers 32 and the sacrificial cap layer 70.

Each backside recess (33, 37) can be a laterally extending cavity having a lateral dimension that is greater than the vertical extent of the cavity. In other words, the lateral dimension of each backside recess (33, 37) can be greater than the height of the backside recess (33, 37). A plurality of backside recesses (33, 37) can be formed in the volumes from which the first material of the sacrificial material layers 32 and the material of the sacrificial cap layer 70 are removed. The memory openings in which the memory stack structures 55 are formed are herein referred to as front side openings or front side cavities in contrast with the backside recesses (33, 37). In one embodiment, the memory array region 100 comprises an array of monolithic three-dimensional NAND strings having a plurality of device levels disposed above the substrate (9, 10). In this case, each backside recess (33, 37) can define a space for receiving a respective word line of the array of monolithic three-dimensional NAND strings.

Each of the plurality of backside recesses (33, 37) can extend substantially parallel to the top surface of the substrate (9, 10). A backside recess 33 can be vertically bounded by a top surface of an underlying electrically conductive layer 46 and a bottom surface of an overlying electrically conductive layer 46. In one embodiment, each backside recess (33, 37) can have a uniform height throughout.

Referring to FIG. 9A, physically exposed portions of the silicon oxide layer 52 can be etched at each level of the backside recesses (33, 37), i.e., at each level of the sacrificial material layers 32 and the sacrificial cap layer 70, by an isotropic etch process such as a wet etch process. For example, a wet etch process employing hydrofluoric acid can be employed to etch physically exposed portions of the silicon oxide layer 52 by introducing hydrofluoric acid through the backside trenches 79 and the backside recesses (33, 37). The duration of the isotropic etch process is selected such that the silicon oxide material of the silicon oxide layer 52 is removed only from the levels of the backside recesses (33, 37), and portions of the silicon oxide layer 52 remain at each level of the electrically conductive layers 46. Each remaining portion of the silicon oxide layer 52 can be topologically homeomorphic to a torus, i.e., can have a respective annular shape, and is herein referred to as an annular silicon oxide structure 501. A remaining horizontal portion of the silicon oxide layer 52 directly on a top surface of the dielectric metal oxide plate 144 and directly underneath the bottommost surface of the charge storage material layer 54 constitutes a silicon oxide plate 502. Each memory film 50 includes a silicon oxide plate 502, annular dielectric metal oxide structures 142, annular silicon oxide structures 501, a charge storage material layer 54, and a tunneling dielectric layer 56.

Referring to FIG. 9B, portions of the charge storage material layer 54 at levels of the backside recesses (33, 37) can be removed selective to the electrically conductive layers 46 and the annular silicon oxide structures 501 by an isotropic etch process. For example, if the charge storage material layer 54 includes silicon nitride, a wet etch employing hot phosphoric acid can be employed to etch the portions of the charge storage material layer 54 from the levels of the backside recesses (33, 37) by introducing hot phosphoric acid through the backside trenches 79 and the backside recesses (33, 37). Each remaining portion of the charge storage material layer 54 can be topologically homeomorphic to a torus, and is herein referred to as an annular charge storage structure 542. A remaining horizontal portion of the charge storage material layer 54 directly on a top surface of the silicon oxide plate 502 and directly underneath the bottommost surface of the tunneling dielectric layer 56 constitutes a charge storage material plate 544. Each memory film 50 includes a silicon oxide plate 502, a charge storage material plate 544, annular dielectric metal oxide structures 142, annular silicon oxide structures 501, annular charge storage structures 542, and a tunneling dielectric layer 56.

Discrete nested annular structures (542, 501, 142) are formed at each level of the electrically conductive layers 46. Each one of the nested annular structures (542, 501, 142) includes, from inside to outside, a respective one of the annular charge storage structures 542, a respective one of the annular silicon oxide structures 501, and a respective one of the annular dielectric metal oxide structures 142. A charge storage material plate 544 contacts a bottom surface of the tunneling dielectric layer 56. A silicon oxide plate 502 contacts a bottom surface of the charge storage material plate 544.

Referring to FIG. 9C, an insulating material is deposited by a non-conformal deposition process to form void-containing insulating layers 74L at the levels of the backside recesses (33, 37). As used herein, a "void-containing" structure refers to a structure including a volume that does not contain solid or liquid therein, and is defined by a set of at least one inner surface that defines a completely encapsulated volume therein. Each void-containing insulating layer 74L includes a respective encapsulated void (e.g., air gap) (33', 37') therein. Each encapsulated void (33', 37') can be located entirely within the level of a respective backside recess (33, 37), i.e., between a neighboring pair of electrically conductive layers 46, between the bottommost electrically conductive layer 46 and the substrate (9, 10), or between the topmost electrically conductive layer 46 and the contact level dielectric layer 73. The void-containing insulating layers 74L are formed within the backside recesses (33, 37) by anisotropically depositing the insulating material such as silicon oxide. For example, the void-containing insulating layers 74L can be deposited by plasma enhanced chemical vapor deposition.

Alternatively, a conformal deposition process may be employed to form void-free insulating layers in lieu of void-containing insulating layers 74L. Referring to FIG. 9D, an alternative embodiment of the first exemplary structure according to the first embodiment of the present disclosure is illustrated, which can be derived from the first exemplary structure of FIG. 9B by conformally depositing an insulating material to form void-free insulating layers 174 in lieu of void-containing insulating layers 74L. The void-free insulating layers 174 include an insulating material such as silicon oxide, and can be deposited by a conformal deposition process such as low pressure chemical vapor deposition (LPCVD).

Figure 10:
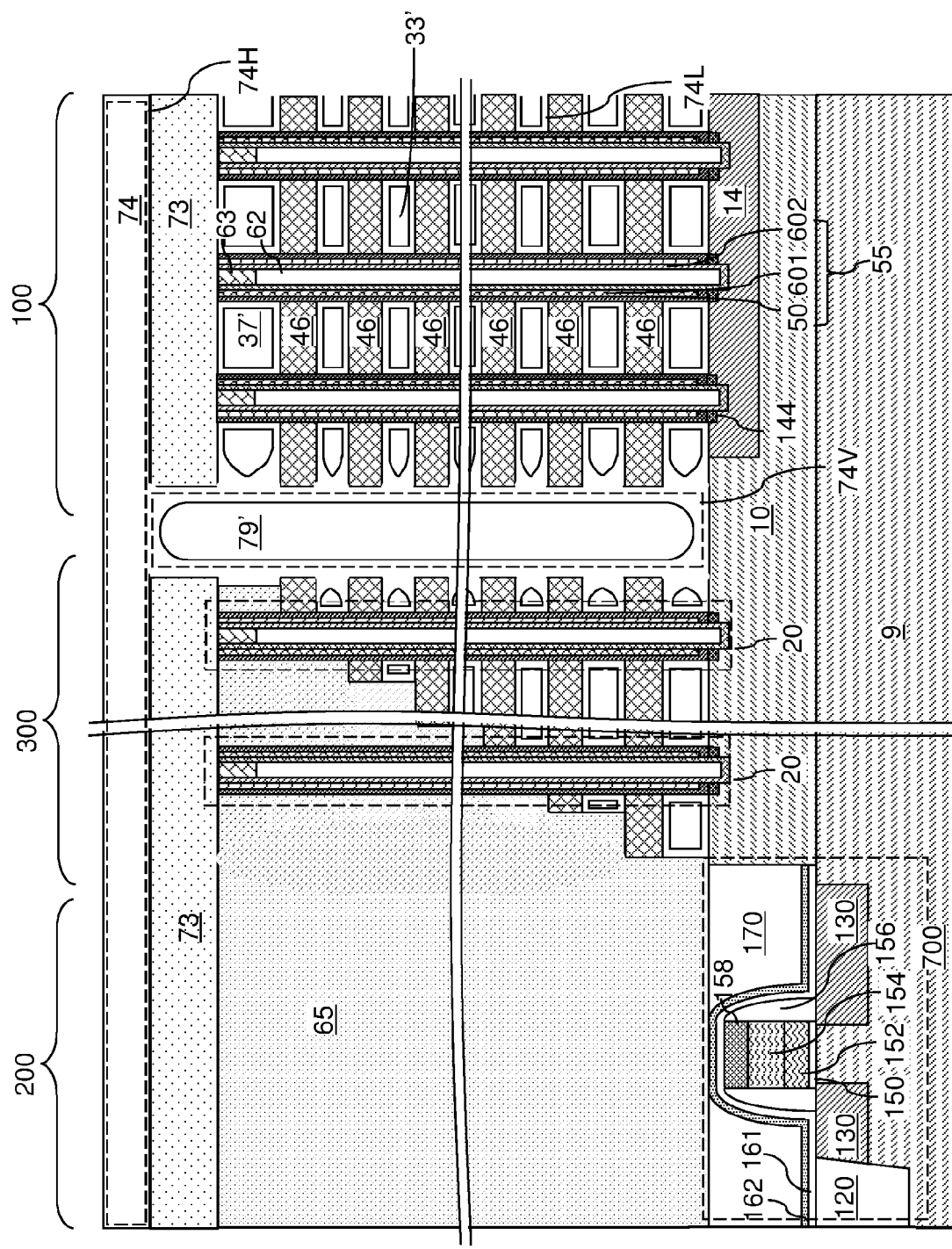
FIG. 10 is a schematic vertical cross-sectional view of the first exemplary structure at the processing step of FIG. 9C.

Referring to FIG. 10, the first exemplary structure is illustrated at the processing step of FIG. 9C. The non-conformally deposited insulating material that forms the void-containing insulating layers 74L at the levels of the backside recesses (33, 37) is deposited at peripheral portions of the backside trenches to form void-containing insulating wall structures 74V. Each of the void-containing insulating wall structures 74V can include a vertical void 79' that extends through each of the electrically conductive layers 46 within the alternating stack of insulating layers (which can be void-containing insulating layers 74L or void-free insulating layers 174) and the electrically conductive layers 46. The portion of the deposited insulating material over the top surface of the contact level dielectric layer 73 constitutes a planar insulating material layer 74.

Figure 11A:
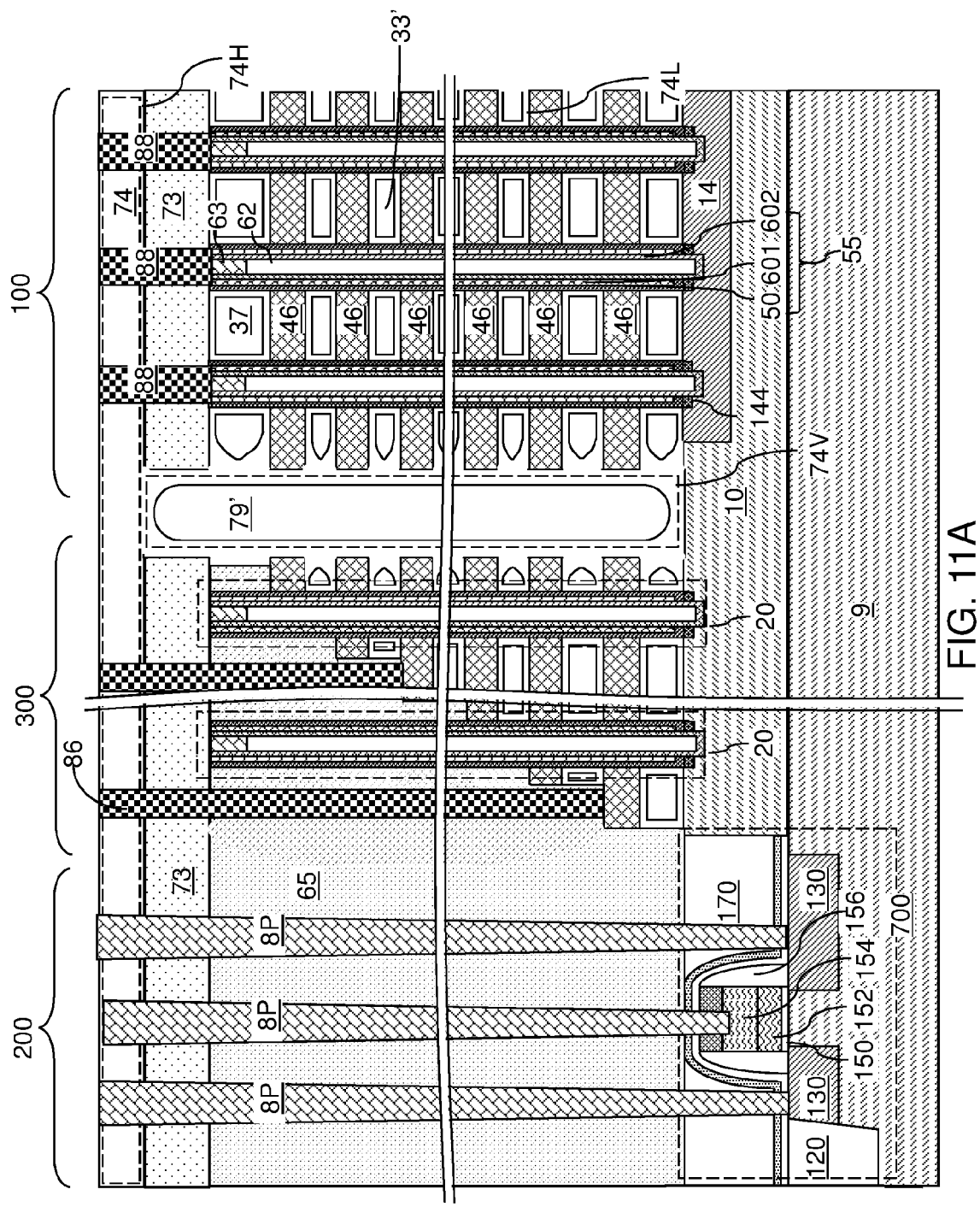
FIG. 11A is a schematic vertical cross-sectional view of the first exemplary structure after formation of contact via structures according to the first embodiment of the present disclosure.
Figure 11C:
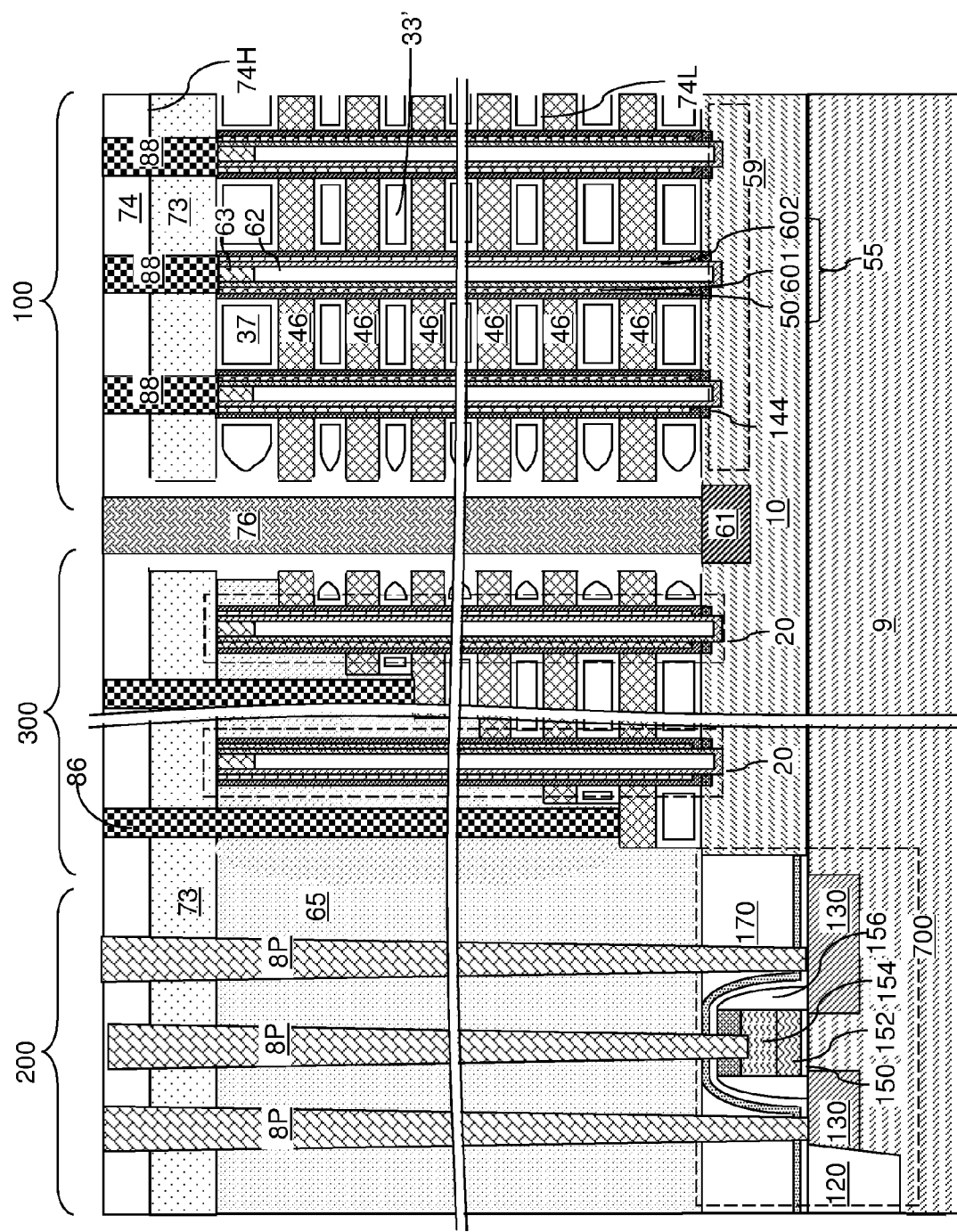
FIG. 11C is a schematic vertical cross-sectional view of an alternative embodiment of the first exemplary structure after formation of a backside contact via structure and additional contact via structures according to the first embodiment of the present disclosure.

Referring to FIGS. 11A and 11B, contact via structures (88, 86, 8P) can be formed through the planar insulating material layer 74, the contact level dielectric layer 73, and through the retro-stepped dielectric material portion 65. For example, drain contact via structures 88 can be formed through the planar insulating material layer 74 and the contact level dielectric layer 73 on each drain region 63. Word line contact via structures 86 can be formed on the electrically conductive layers 46 through the planar insulating material layer 74, the contact level dielectric layer 73, and the retro-stepped dielectric material portion 65. Peripheral device contact via structures 8P can be formed through the planar insulating material layer 74 and the retro-stepped dielectric material portion 65 directly on respective nodes of the peripheral devices. The source contact via to the buried source layer 14 is located outside the boundary of FIGS. 11A and 11B.

Referring to FIG. 11C, an alternative embodiment of the first exemplary structure is shown, which can be derived from the first exemplary structure. In this case, formation of the buried source layer 14 can be omitted. A backside contact via cavity can be formed after the processing steps of FIG. 10 by removing a portion of the planar insulating material layer 74 and the upper and lower horizontal portions of the void-containing insulating wall structures 74V. For example, a photoresist layer can be applied over the planar insulating material layer 74, and can be patterned to form an opening overlying the void-containing insulating wall structures 74V. The physically exposed portion of the planar insulating material layer 74 and the upper and lower horizontal portions of the void-containing insulating wall structures 74V can be removed by an anisotropic etch. The photoresist layer can be subsequently removed, for example, by ashing. A source region 61 can be formed by ion implantation into an upper portion of the semiconductor material layer 10 through the backside contact via cavity. A horizontal channel region 59 can be formed in an upper portion of the semiconductor material layer 10 between the source region 61 and the memory stack structures 55. The volume of the backside contact via cavity can be subsequently filled with at least one conductive material (e.g., tungsten and/or TiN) to form a backside contact via structure 76, which can be a source contact via structure.

According to a second embodiment of the present disclosure, lateral recessing of the electrically conductive layers 46 can be performed prior to formation of the annular metal structures at the processing steps of FIG. 5B. FIGS. 12A-12J are sequential schematic vertical cross-sectional views of a memory opening within a second exemplary structure during formation of a memory stack structure 55, a dielectric core 62, and a drain region 63 according to a second embodiment of the present disclosure. Referring to FIG. 12A, the second exemplary structure according to the second embodiment of the present disclosure can be derived from the first exemplary structure illustrated in FIG. 5A by laterally recessing the electrically conductive layers 46 relative to the sacrificial material layers 32 and the sacrificial cap layer 70. An isotropic etch that etches the metallic material or the doped semiconductor material of the electrically conductive layers 46 selective to the materials of the sacrificial material layers 32 and the sacrificial cap layer 70 can be employed. The lateral recess distance may be in a range from 1.2 nm to 15 nm, such as from 2 nm to 6 nm, although lesser and greater thicknesses can also be employed. Annular lateral recesses 240 can be formed at levels of the electrically conductive layers 46 around each memory opening 49 and around each support opening 19. The annular lateral recesses can protrude outward from vertical planes including the sidewalls of the sacrificial material layers 32 at each level of the electrically conductive layers 16 around the memory openings 49 and the support openings 19.

Referring to FIG. 12B, the processing steps of FIG. 5B can be performed to form annular metal structures 141 in respective annular lateral recesses 240 on each continuous sidewall of the electrically conductive layers 46. The thickness of each annular metal structure 141, as measured between an inner sidewall and the outer sidewall of the annular metal structure 141, can be in a range from 1 nm to 10 nm, although lesser and greater thicknesses can also be employed. In some embodiment, a metal plate 143 can be deposited on the physically exposed surface of the buried source layer 14 or the semiconductor material layer 10 at the bottom of each memory opening 49 and on the physically exposed surface of semiconductor material layer 10 at the bottom of each support opening 19.

Referring to FIG. 12C, the processing steps of FIG. 5C can be performed to covert the annular metal structures 141 into annular dielectric metal oxide structures 142. The thickness of the annular dielectric metal oxide structures 142 and the dielectric metal oxide plates 144 may be in a range from 1.2 nm to 15 nm, such as from 2 nm to 6 nm, although lesser and greater thicknesses can also be employed. The annular dielectric metal oxide structures 142 can be formed in the annular lateral recesses around each memory opening 49 and around each support opening 19.

In one embodiment, the inner sidewalls of the annular dielectric metal oxide structures 142 may be vertically coincident with the sidewalls of the sacrificial material layers 32. In another embodiment, the inner sidewalls of the annular dielectric metal oxide structures 142 may be located farther away from the vertical axis VX passing through the geometrical center of each memory opening 49 than the sidewalls of the sacrificial material layers 32 are from the vertical axis VX. In yet another embodiment, the inner sidewalls of the annular dielectric metal oxide structures 142 may be closer to the vertical axis VX passing through the geometrical center of each memory opening 49 than the sidewalls of the sacrificial material layers 32 are from the vertical axis VX.

Alternatively, in case the electrically conductive layers 46 include a material (such as) that can form a dielectric metal oxide, the processing steps of FIG. 12B can be omitted, and the annular dielectric metal oxide structures 142 can be formed by oxidation of surface portions of the electrically conductive layers 46 exposed in respective annular lateral recesses 240 around each memory opening 49 and around each support opening 19. In this case, the dielectric metal oxide plates 144 can be replaced with dielectric semiconductor oxide plates. The dielectric metal oxide plate 144 can be formed on a top surface of the semiconductor substrate (9, 10) underneath each memory opening 49 and underneath each support opening 19 concurrently with formation of the annular dielectric metal oxide structures 142.

The annular dielectric metal oxide structures 142 are formed on sidewalls of the electrically conductive layers 46 around each memory opening 49 and around each support opening 19. The annular dielectric metal oxide structures 142 are formed only at the levels of the electrically conductive layers 46, and therefore, are vertically spaced from one another.

Referring to FIG. 12D, the processing steps of FIG. 5D can be performed to form a silicon oxide layer 52 and a charge storage material layer 54. The inner and outer sidewalls of the silicon oxide layer 52 and the charge storage material layer 54 may be vertical in case the inner sidewalls of the annular dielectric metal oxide structures 142 are vertically coincident with the sidewalls of the sacrificial material layers 32, or may have radial undulation in case the inner sidewalls of the annular dielectric metal oxide structures 142 are not vertically coincident with the sidewalls of the sacrificial material layers 32.

Referring to FIG. 12E, the processing steps of FIG. 5E can be performed to form a tunneling dielectric layer 56 and a first semiconductor channel layer 601L. The inner and outer sidewalls of the tunneling dielectric layer 56 and the first semiconductor channel layer 601L may be vertical in case the inner sidewalls of the annular dielectric metal oxide structures 142 are vertically coincident with the sidewalls of the sacrificial material layers 32, or may have radial undulation in case the inner sidewalls of the annular dielectric metal oxide structures 142 are not vertically coincident with the sidewalls of the sacrificial material layers 32. Referring to FIG. 12F, the processing steps of FIG. 5F can be performed to remove horizontal portions of the first semiconductor channel layer 601L, the tunneling dielectric layer 56, the charge storage material layer 54, the silicon oxide layer 52 from above the sacrificial cap layer 70 and at the bottom of each memory opening 49 and each support opening 19.

Referring to FIG. 12G, the processing steps of FIG. 5G can be performed to form a second semiconductor channel layer 602L. Referring to FIG. 12H, in case the memory cavity 49' in each memory opening is not completely filled by the second semiconductor channel layer 602L, the processing steps of FIG. 5H can be performed to deposit a dielectric core layer 62L to fill any remaining portion of the memory cavity 49' within each memory opening 49. Referring to FIG. 12I, the processing steps of FIG. 5I can be performed to remove portions of the dielectric core layer 62L and the second semiconductor channel layer 602L from above the sacrificial cap layer 70. Referring to FIG. 12J, the processing steps of FIG. 5J can be performed to form a drain region 63 within each memory opening 49.

Subsequently, the processing steps of FIGS. 7A, 7B, 8, and 9A-9C can be sequentially performed. FIG. 13A illustrates a region of the second exemplary structure at the processing steps of FIG. 9A, FIG. 13B illustrates a region of the second exemplary structure at the processing steps of FIG. 9B, and FIG. 13C illustrates a region of the second exemplary structure at the processing steps of FIG. 9C. At the end of the processing steps of FIG. 13B, discrete nested annular structures (542, 501, 142) are formed at each level of the electrically conductive layers 46. Each one of the nested annular structures (542, 501, 142) includes, from inside to outside, a respective one of the annular charge storage structures 542, a respective one of the annular silicon oxide structures 501, and a respective one of the annular dielectric metal oxide structures 142. A charge storage material plate 544 contacts a bottom surface of the tunneling dielectric layer 56. A silicon oxide plate 502 contacts a bottom surface of the charge storage material plate 544.

At the end of the processing steps of FIG. 13C, an insulating material is deposited by a non-conformal deposition process to form void-containing insulating layers 74L at the levels of the backside recesses (33, 37). As used herein, a "void-containing" structure refers to a structure including a volume that does not contain solid or liquid therein, and is defined by a set of at least one inner surface that defines a completely encapsulated volume therein. Each void-containing insulating layer 74L includes a respective encapsulated void (33', 37') therein. Each encapsulated void (33', 37') can be located entirely within the level of a respective backside recess (33, 37), i.e., between a neighboring pair of electrically conductive layers 46, between the bottommost electrically conductive layer 46 and the substrate (9, 10), or between the topmost electrically conductive layer 46 and the contact level dielectric layer 73. The void-containing insulating layers 74L are formed within the backside recesses (33, 37) by anisotropically depositing the insulating material such as silicon oxide. For example, the void-containing insulating layers 74L can be deposited by plasma enhanced chemical vapor deposition.

Alternatively, a conformal deposition process may be employed to form void-free insulating layers in lieu of void-containing insulating layers 74L. Referring to FIG. 13D, an alternative embodiment of the first exemplary structure according to the first embodiment of the present disclosure is illustrated, which can be derived from the first exemplary structure of FIG. 13B by conformally depositing an insulating material to form void-free insulating layers 174 in lieu of void-containing insulating layers 74L. The void-free insulating layers 174 include an insulating material such as silicon oxide, and can be deposited by a conformal deposition process such as low pressure chemical vapor deposition (LPCVD).

After formation of the structure of FIG. 13C or FIG. 13D, the processing steps of FIGS. 11A and 11B or 11C can be performed to form various contact via structures (86, 88, 8P).

Referring to FIGS. 14A-14C, a third exemplary structure according to a third embodiment of the present disclosure is illustrated.

Referring to FIG. 14A, the third exemplary structure can be identical to the first exemplary structure at the processing steps of FIG. 5A. Optionally, the sidewalls of the electrically conductive layers 46 may be laterally recessed as in the second embodiment.

Referring to FIG. 14B, a continuous dielectric metal oxide layer (140, 142, 144) can be deposited as a conformal material layer on the physically exposed surfaces of the memory openings 49 and the support openings 19 and of the sacrificial cap layer 70. The thickness of the continuous dielectric metal oxide layer (140, 142, 144) may be in a range from 1.5 nm to 20 nm, such as from 3 nm to 8 nm, although lesser and greater thicknesses can also be employed.

The continuous dielectric metal oxide layer (140, 142, 144) includes a dielectric metal oxide material of which the crystallinity is affected by the crystalline structures of underlying surfaces. For example, the continuous dielectric metal oxide layer (140, 142, 144) can include aluminum oxide, which is known to be deposited with different crystallinity depending on the crystallinity of underlying surfaces. Generally speaking, the continuous dielectric metal oxide layer (140, 142, 144) can include any dielectric metal oxide material that provides crystalline structure modulation based on the crystallinity of underlying surfaces. Specifically, first portions 142 of the continuous dielectric metal oxide layer (140, 142, 144) deposited on the sidewalls of the electrically conductive layers 46 are crystalline (i.e., polycrystalline), and second portions 140 of the continuous dielectric metal oxide layer (140, 142, 144) deposited on sidewalls of the sacrificial material layers 32 and the sacrificial cap layer 140 can be amorphous. A third portion 144 of the continuous dielectric metal oxide layer (140, 142, 144) deposited on the top surfaces of the buried source layer 14 or the semiconductor material layer 10 can be crystalline.

Referring to FIG. 14C, annular dielectric metal oxide structures 142 can be formed by etching the second portions 140 of the continuous dielectric metal oxide layer (140, 142, 144) selective to the first portions 142 and the third portions 144 of the continuous dielectric metal oxide layer (140, 142, 144). For example, if the continuous dielectric metal oxide layer (140, 142, 144) includes polycrystalline aluminum oxide in the first portions 142 and the third portions 144 and amorphous aluminum oxide in the second portions 140, the amorphous aluminum oxide material of the second portions 140 can be removed at a greater etch rate than the polycrystalline aluminum oxide material of the first portions 142 and the third portions 144 in a selective etchant, such as an etchant including dilute hydrofluoric acid (e.g., hydrofluoric acid and deionized water having a 1:50 ratio). The remaining first portions 142 of the continuous dielectric metal oxide layer (140, 142, 144) constitute the annular dielectric metal oxide structures 142. Each remaining third portion 144 of the continuous dielectric metal oxide layer (140, 142, 144) constitutes a dielectric metal oxide plate 144. The thickness of the annular dielectric metal oxide structures 142 may be in a range from 1.2 nm to 15 nm, such as from 2 nm to 6 nm, although lesser and greater thicknesses can also be employed.

Subsequently, the processing steps of FIG. 5D-5J, 6, 7A, 7B, 8, 9A-9C (or 9A, 9B, and 9D), 10 and 11A or 11C can be performed to form a third exemplary structure, which can be the same as the first exemplary structure illustrated in FIGS. 11A and 11B, or the second exemplary structure at the processing steps of FIGS. 13A and 13B.

The various exemplary structures of the present disclosure can include a three-dimensional memory device. The three-dimensional memory device can include: an alternating stack of insulating layers (74L or 174) and electrically conductive layers 46 located over a substrate (9, 10); memory stack structures 55 extending through the alternating stack. Each of the memory stack structures 55 comprises a memory film 50 and a vertical semiconductor channel 60 contacting an inner sidewall of the memory film. The memory film 50 comprises, from inside to outside: a tunneling dielectric layer 56 that vertically extends through the alternating stack; and discrete nested annular structures (542, 501, 142) located at each level of the electrically conductive layers 46. Each one of the nested annular structures (542, 501, 142) includes, from inside to outside, an annular charge storage structure 542, an annular silicon oxide structure 501, and an annular dielectric metal oxide structure 142.

In one embodiment, each annular dielectric metal oxide structure 142 vertically extends from a top surface of an underlying one of the insulating layers (74L or 174) to a bottom surface of an overlying one of the insulating layers (74L or 174). In one embodiment, the insulating layers 74L can be void-containing insulating layers 74L including a respective encapsulated void 33' therein.

In one embodiment, an outer sidewall of the tunneling dielectric layer 56 contacts an inner surface of each annular charge storage structure (542, 501, 142). In one embodiment, each interface between an electrically conductive layer 46 and an annular dielectric metal oxide structure 142 has a respective upper periphery of a first closed shape, and a respective lower periphery of a second closed shape. As used herein, a "closed shape" refers to a one-dimensional manifold that is topologically homeomorphic to a circle. The respective upper periphery can contact a bottom surface of a respective overlying insulating layer (74L or 174); and the respective lower periphery can contact a top surface of a respective underlying insulating layer (74L or 174).

In one embodiment, the tunneling dielectric layer 56 has a radially undulating profile, and the tunneling dielectric layer 56 laterally protrudes farther outward from the vertical semiconductor channel 60 at levels of the insulating layers (74L or 174) than at levels of the electrically conductive layers 46.

In some embodiments, each annular dielectric metal oxide structure 142 does not have a clam shape. As used herein a "clam" shape is a side cross sectional shape configured similar to an English letter "C". A clam shape has two segments which extend substantially parallel to each other and to the top surface 7 of the substrate (e.g., of the substrate semiconductor layer 9). The two segments are connected to each other by a third segment which extends substantially perpendicular to the first two segments and the surface 7.

In some embodiments, as illustrated in the second exemplary structure, an entire top surface of each annular dielectric metal oxide structure 142 can be horizontal and can contact an overlying insulating layer, and an entire bottom surface of each annular dielectric metal oxide structure 142 can be horizontal and can contact an underlying insulating layer.

In one embodiment, the three-dimensional memory device can include a charge storage material plate 544 contacting a bottom surface of the tunneling dielectric layer 56 and comprising the same material as the annular charge storage structures 542, and a silicon oxide plate 502 contacting a bottom surface of the charge storage material plate 544 and comprising silicon oxide. In one embodiment, the three-dimensional memory device can include a dielectric metal oxide plate 144 contacting a bottom surface of the silicon oxide plate 502 and comprising the same material as the annular dielectric metal oxide structures 142 and laterally surrounding the vertical semiconductor channel 60.

In one embodiment, the alternating stack comprises a terrace region in which each electrically conductive layer 46 other than a topmost electrically conductive layer 46 within the alternating stack laterally extends farther than any overlying electrically conductive layer 46 within the alternating stack. The terrace region can include stepped surfaces of the alternating stack that continuously extend from a bottommost layer within the alternating stack to a topmost layer within the alternating stack. Support pillar structures 20 extend through the stepped surfaces and through a retro-stepped dielectric material portion 65 that overlies the stepped surfaces.

In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as at least one annular charge storage structure 542 at a level of an electrically conductive layer 46) in a first device level of the array of monolithic three-dimensional NAND strings can be located over another memory cell (as embodied as at least another annular charge storage structure 542 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels 60 extends substantially perpendicular to a top surface of the substrate (9, 10); and a plurality of charge storage elements (as embodied as charge trapping material portions). Each charge storage element can be located adjacent to a respective one of the plurality of semiconductor channels 60.

The above described method and device may have the following non-limiting advantages over prior art structures. The device contains discrete charge storage structures 54 which reduce or eliminate the charge migration that may occur in prior art continuous silicon nitride charge storage layers. The air gap 33' between adjacent control gate electrodes 46 improves the separation and isolation between adjacent memory cells and control gate electrodes 46. By starting with an alternating stack which contains electrically conductive layers (e.g., control gate electrodes) 46, the air gaps 33' may be formed by a single replacement of sacrificial layers 32 compared to double replacement of some prior art processes.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate; and
   memory stack structures extending through the alternating stack, wherein each of the memory stack structures comprises a memory film and a vertical semiconductor channel contacting an inner sidewall of the memory film,
   wherein the memory film comprises, from inside to outside:
   a tunneling dielectric layer that vertically extends through the alternating stack; and
   discrete annular structures located at each level of the electrically conductive layers, wherein each one of the annular structures includes, from inside to outside, an annular charge storage structure, and an annular blocking dielectric comprising an annular dielectric metal oxide structure.

2. The three-dimensional memory device of claim 1, wherein each annular dielectric metal oxide structure vertically extends from a top surface of an underlying one of the insulating layers to a bottom surface of an overlying one of the insulating layers and wherein the annular dielectric metal oxide structure does not have a clam shape.

3. The three-dimensional memory device of claim 1, wherein the insulating layers are void-containing insulating layers including a respective encapsulated void therein.

4. The three-dimensional memory device of claim 1, wherein an outer sidewall of the tunneling dielectric layer contacts an inner surface of each annular charge storage structure.

5. The three-dimensional memory device of claim 1, wherein the annular dielectric metal oxide structure comprises aluminum oxide and the electrically conductive layers comprise aluminum metal layers.

6. The three-dimensional memory device of claim 1, wherein the annular dielectric metal oxide structure comprises aluminum oxide and the electrically conductive layers comprise at least one of W, Mo, Co or Ru metal layers.

7. The three-dimensional memory device of claim 1, wherein:
   the tunneling dielectric layer has a radially undulating profile; and
   the tunneling dielectric layer laterally protrudes farther outward from the vertical semiconductor channel at levels of the insulating layers than at levels of the electrically conductive layers.

8. The three-dimensional memory device of claim 1, wherein the annular blocking dielectric further comprises an annular silicon oxide structure.

9. The three-dimensional memory device of claim 1, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
support pillar structures extend through the stepped surfaces and through a retro-stepped dielectric material portion that overlies the stepped surfaces.

10. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level.

11. The three-dimensional memory device of claim 8, further comprising:
a charge storage material plate contacting a bottom surface of the tunneling dielectric layer and comprising a same material as the annular charge storage structures;
a silicon oxide plate contacting a bottom surface of the charge storage material plate and comprising silicon oxide; and
a dielectric metal oxide plate contacting a bottom surface of the silicon oxide plate and comprising a same material as the annular dielectric metal oxide structures and laterally surrounding the vertical semiconductor channel.

12. A method of forming a three-dimensional memory device, comprising:
forming an alternating stack of sacrificial material layers and electrically conductive layers over a substrate;
forming a memory opening through the alternating stack;
forming an annular blocking dielectric comprising annular dielectric metal oxide structures on sidewalls of the electrically conductive layers around the memory opening, wherein the annular dielectric metal oxide structures are vertically spaced from one another;
forming a charge storage material layer, a tunneling dielectric layer, and a vertical semiconductor channel inside the annular dielectric metal oxide structures in a remaining volume of the memory opening;
forming lateral recesses by removing the sacrificial material layers selective to the electrically conductive layers; and
etching the charge storage material layer at levels of the lateral recesses to form annular charge storage structures.

13. The method of claim 12, further comprising forming void-containing insulating layers including a respective encapsulated void therein within the backside recesses by anisotropically depositing an insulating material therein.

14. The method of claim 12, wherein the annular dielectric metal oxide structures are formed by:
selectively depositing a metal on the sidewalls of the electrically conductive layers around the memory opening without depositing the metal on surfaces of the sacrificial material layers to form annular metal structures; and
converting the annular metal structures into the annular dielectric metal oxide structures by an oxidation process.

15. The method of claim 12, wherein the annular dielectric metal oxide structures are formed by oxidation of surface portions of the electrically conductive layers around the memory opening.

16. The method of claim 12, wherein the annular dielectric metal oxide structures are formed by:
depositing a continuous dielectric metal oxide layer in the memory opening, wherein first portions of the continuous dielectric metal oxide layer deposited on the sidewalls of the electrically conductive layers are crystalline and second portions of the continuous dielectric metal oxide layer deposited on sidewalls of the sacrificial material layers are amorphous; and
etching the second portions of the continuous dielectric metal oxide layer selective to the first portions of the continuous dielectric metal oxide layer, wherein the first portions of the continuous dielectric metal oxide layer constitute the annular dielectric metal oxide structures.

17. The method of claim 12, wherein:
a dielectric metal oxide plate is formed on a top surface of the substrate underneath the memory opening concurrently with formation of the annular dielectric metal oxide structures;
a center portion of the dielectric metal oxide plate is etched to form an opening therein; and
the vertical semiconductor channel is formed through the opening and on the substrate.

18. The method of claim 12, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level.

19. The method of claim 14, further comprising forming a silicon oxide layer in the remaining volume of the memory opening prior to forming the charge storage material layer and etching the silicon oxide layer at the levels of the lateral recesses.

20. The method of claim 14, further comprising laterally recessing the sidewalls of the electrically conductive layers around the memory opening to form annular lateral recesses at levels of the electrically conductive layers, wherein the annular dielectric metal oxide structures are formed in the annular lateral recesses.

21. The method of claim 14, wherein the annular dielectric metal oxide structure comprises aluminum oxide, the metal comprises aluminum, and the electrically conductive layers comprise at least one of W, Mo, Co or Ru metal layers.

22. The method of claim 19, wherein:
the silicon oxide layer, the charge storage material layer, and the tunneling dielectric layer are formed with a respective radially undulating profile; and
each of the silicon oxide layer, the charge storage material layer, and the tunneling dielectric layer laterally protrudes farther outward from a vertical axis passing through a geometrical center of the memory opening at levels of the sacrificial material layers than at levels of the electrically conductive layers.

23. The method of claim 19, wherein:
a remaining portion of the charge storage material layer that underlies the tunneling dielectric layer after etching the charge storage material layer forms a charge storage material plate contacting a bottom surface of the tunneling dielectric layer; and
a remaining portion of the silicon oxide layer that underlies the tunneling dielectric layer after etching the silicon oxide layer forms a silicon oxide plate contacting a bottom surface of the charge storage material plate.

24. The method of claim 15, wherein the annular dielectric metal oxide structures comprise aluminum oxide and the electrically conductive layers comprise aluminum metal layers.

* * * * *